United States Patent
Chang et al.

(10) Patent No.: US 11,598,002 B2
(45) Date of Patent: Mar. 7, 2023

(54) THIO(DI)SILANES

(71) Applicant: DOW SILICONES CORPORATION, Midland, MI (US)

(72) Inventors: Noel Mower Chang, Midland, MI (US); Byung K. Hwang, Midland, MI (US); Brian David Rekken, Midland, MI (US); Vasgen Aram Shamamian, Midland, MI (US); Xianghuai Wang, Midland, MI (US); Xiaobing Zhou, Midland, MI (US)

(73) Assignee: DDP SPECIALTY ELECTRONIC MATERIALS US 9, LLC, Wilmington, DE (US)

( * ) Notice: Subject to any disclaimer, the term of this patent is extended or adjusted under 35 U.S.C. 154(b) by 598 days.

(21) Appl. No.: 16/338,148

(22) PCT Filed: Oct. 10, 2017

(86) PCT No.: PCT/US2017/055857
§ 371 (c)(1),
(2) Date: Mar. 29, 2019

(87) PCT Pub. No.: WO2018/071371
PCT Pub. Date: Apr. 19, 2018

(65) Prior Publication Data
US 2020/0024737 A1    Jan. 23, 2020

Related U.S. Application Data

(60) Provisional application No. 62/407,008, filed on Oct. 12, 2016.

(51) Int. Cl.
*C23C 16/455* (2006.01)
*C23C 16/30* (2006.01)
(Continued)

(52) U.S. Cl.
CPC ........ *C23C 16/45553* (2013.01); *C07F 7/025* (2013.01); *C23C 16/305* (2013.01);
(Continued)

(58) Field of Classification Search
CPC ............ C23C 16/45553; C23C 16/305; C23C 16/345; C23C 16/401; C23C 16/56
See application file for complete search history.

(56) References Cited

U.S. PATENT DOCUMENTS

| 9,382,268 B1* | 7/2016 | Kuchenbeiser | ....... C23C 16/401 |
| 2009/0126604 A1 | 5/2009 | Akhtar et al. | |
| 2017/0298510 A1* | 10/2017 | Husson | ................. C23C 16/402 |

FOREIGN PATENT DOCUMENTS

| CN | 103801394 A | 5/2014 |
| EP | 0671487 A1 | 9/1995 |

(Continued)

OTHER PUBLICATIONS

Machine assisted English translation of JPS62252304A obtained from https://worldwideespacenet.com on Nov. 23, 2020, 5 pages.
(Continued)

*Primary Examiner* — Kelly M Gambetta
(74) *Attorney, Agent, or Firm* — Warner Norcross + Judd LLP

(57) ABSTRACT

A method of forming a film on a substrate is disclosed. The method comprises: heating a thiodisilane according to formula (I) $(R^{1a}R^{1b}R^{1c}CS)_s(R^2{}_2N)_n(Si-Si)X_xH_h$ (I) in a chemical vapor deposition (CVD) or atomic layer deposition (ALD) process under thermal or plasma conditions to give a silicon-containing film disposed on the substrate, wherein: subscript s, n, x, h and $R^{1a}$, $R^{1b}$, $R^{1c}$, $R^2{}_2$, and X are as described herein.

16 Claims, 9 Drawing Sheets

Measured ALD Window for a 2 sec exposure of BBTS followed by 2.5 sec cumulative exposure to O3 (5 consecutive 0.5 sec pulses).

(51) Int. Cl.
| | |
|---|---|
| C23C 16/34 | (2006.01) |
| C23C 16/40 | (2006.01) |
| C07F 7/02 | (2006.01) |
| C23C 16/56 | (2006.01) |

(52) U.S. Cl.
CPC .......... C23C 16/345 (2013.01); C23C 16/401 (2013.01); C23C 16/56 (2013.01)

(56) References Cited

FOREIGN PATENT DOCUMENTS

| GB | 1418609 A | 12/1975 |
|---|---|---|
| JP | S5037731 A | 4/1975 |
| JP | S62252304 A | 11/1987 |
| KR | 1020150034123 A | 4/2015 |
| WO | 2007118474 A2 | 10/2007 |
| WO | 2014015232 A1 | 1/2014 |

OTHER PUBLICATIONS

International Search Report for International Application No. PCT/US2017/055874 dated Jan. 31, 2018, 4 pages.
Machine assisted translation of WO2007118474A2 obtained from https://worldwideespacenet.com on Mar. 27, 2019, 47 pages.
Thompson, James Charlton et al., "Reactions of silicon fluorides with some non-metal hydrides", Canadian Journal of Chemistry, vol. 57, No. 9, 1979, pp. 994-998.
Chihi, Abdelknm et al., "Insertion reactions of dimethylsilylene into silicon-sulfur and sulfur-sulfur single bonds", Journal of Organometallic Chemistry, vol. 210, No. 2, May 5, 1981, pp. 163-168.
Backer, H.J. et al. "Esters of tetrathio orthosilicic acid. II", Database CA Chemical Abstracts Service, Columbus, Ohio, US.
Dey, Rupa R. et al., "Novel protocol for the synthesis of organic ammonium tribromides and investigation of 1,1'-(ethane-1,2-diyl)dipiperidiniumbis(tribromide) in the silylation of alcohols and thiols", Chemistry Letters, vol. 43, No. 10, Jul. 1, 2014, pp. 1545-1547.
International Search Report for International Application No. PCT/US2017/055857 dated Feb. 15, 2018, 5 pages.
Journal of physical and chemical reference data, 1977, 6(3), pp. 919-991.
Machine assisted English translation of CN103801394A obtained from https://patents.google.com/patent on May 5, 2020, 9 pages.
Grumbine, Steven K et al., "Synthesis and Study of Ruthenium Silylene Complexes of the Type [(n5-C5Me5)(Me3P) 2Ru=SiX2]+ (X=Thiolate, Me, and PH)", Organometallics 1998, 17, 5607-5619.
Uhlig, F et al.. Phosphorus, Sulfur, and Silicon, 1994, vol. 90, pp. 29-39.
Muller, Dr. Richard, Zeitschrift fuer Chemie, 1968, 8(7), pp. 254-255.
Wolinski, Leon et al., "Studies in Silico-Organic Compounds: XVII The Action of Bromine on Alkyl Thioethers of Silicon", Journal of Organic Chemistry, 1951, 16, pp. 1138-1142.
Schmeisser, M et al., "CINO3 als Ausgangsmaterial fur Acylnitrate, Uber Aclnitrate und Acylperchlorate (IV.)1)", Angewandte Chemie, 1957, 69, p. 781-782.

* cited by examiner

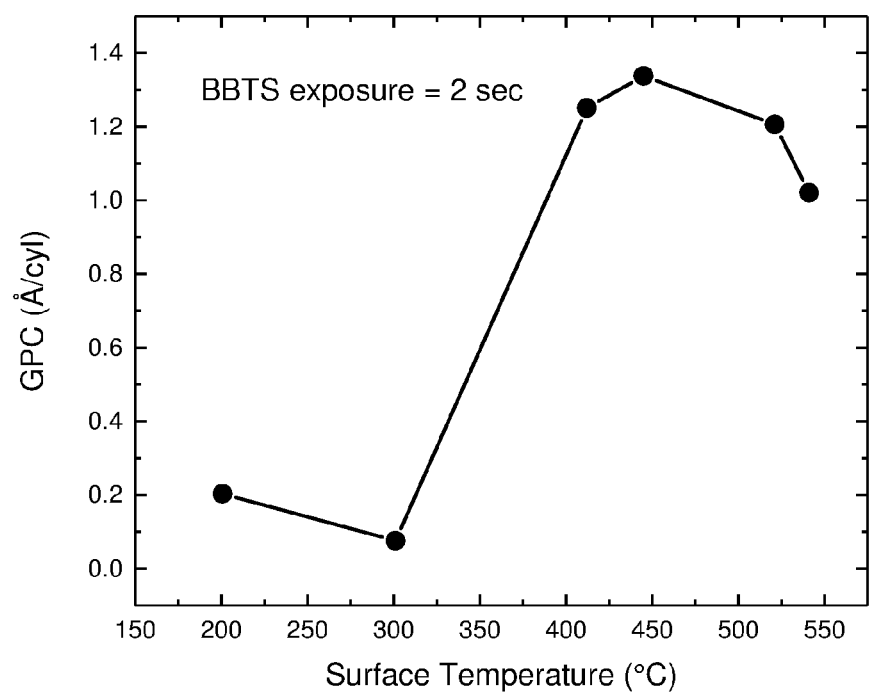
Figure 1: Measured ALD Window for a 2 sec exposure of BBTS followed by 2.5 sec cumulative exposure to O3 (5 consecutive 0.5 sec pulses).

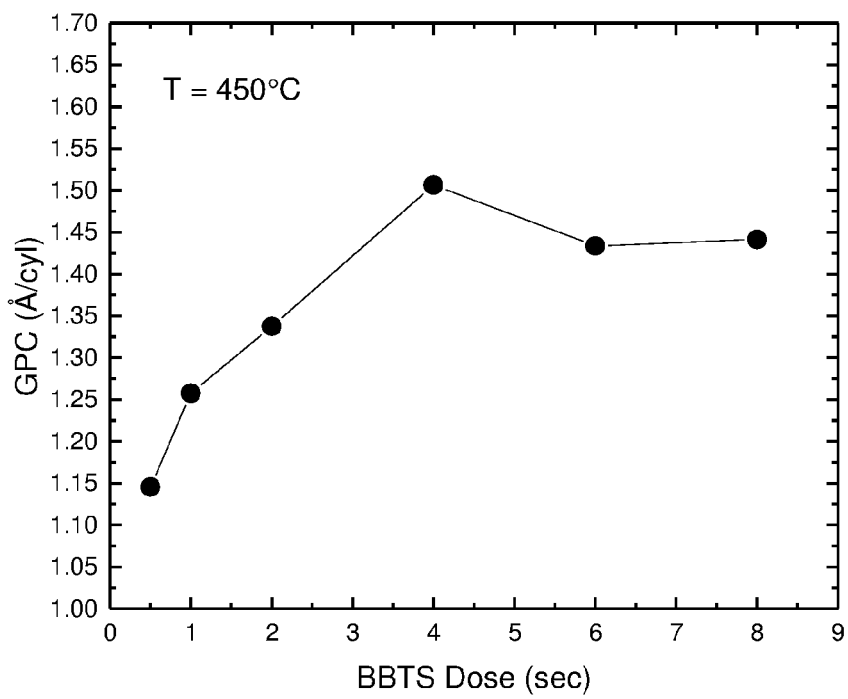
Figure 2: Measured Saturation Curve for BBTS and O3. The curve is obtained by holding the substrate temperature fixed and increasing the exposure time of BBTS. The ozone step at 2.5 sec cumulative dose was found to be in saturation.

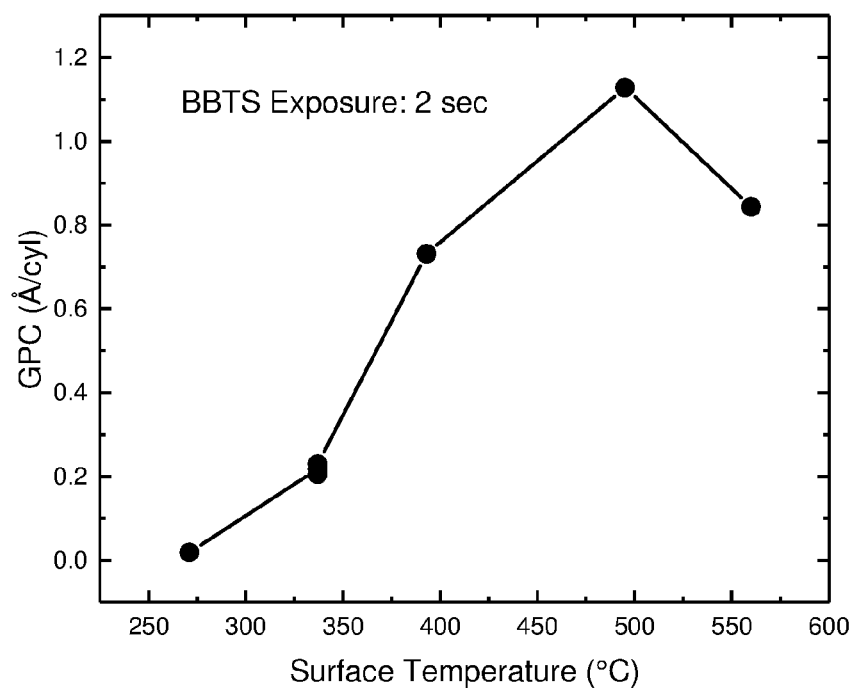
Figure 3: PEALD Window of BBTS and NH3 Plasma to grow a SiN thin film. The BBTS was introduced to the substrate in a 2 second injection, followed by a 10 second NH3 plasma held at 300W. Ar was used to purge between reactants.

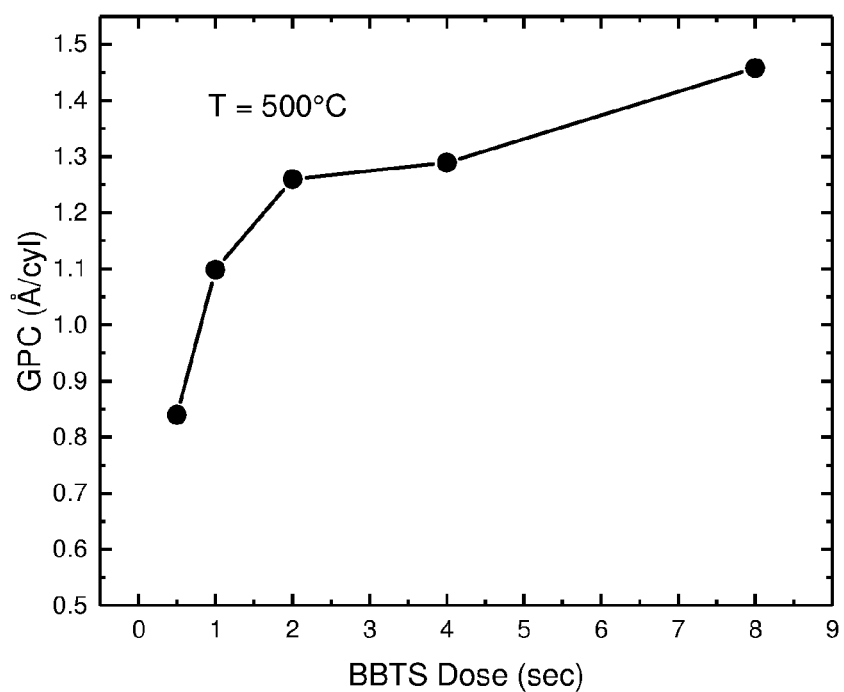
Figure 4: Saturation Curve for BBTS and NH3 Plasma. The substrate temperature was held constant at 500°C.

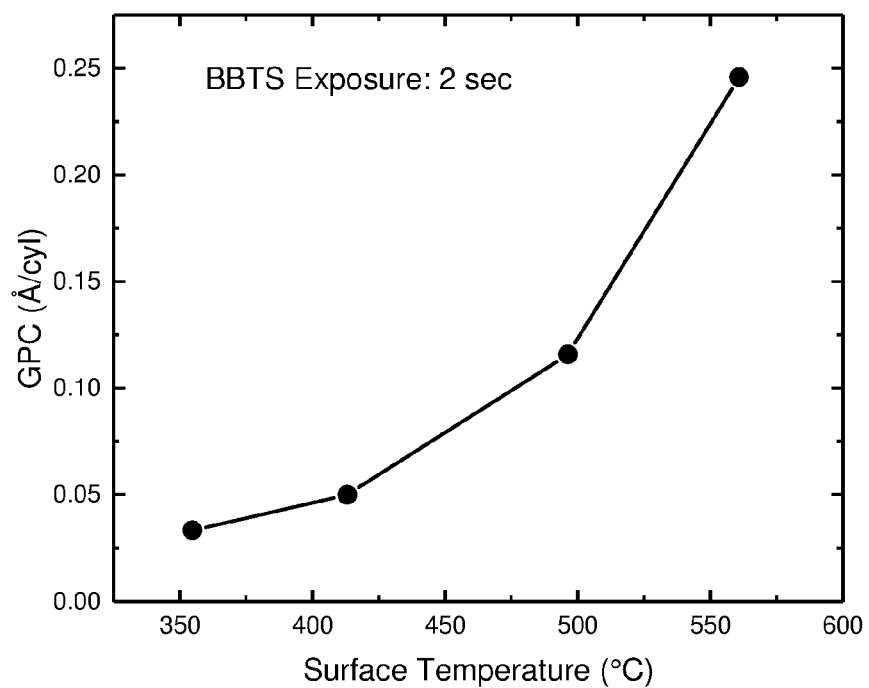
Figure 5: GPC vs Temperature for CVD growth of a SiN thin film

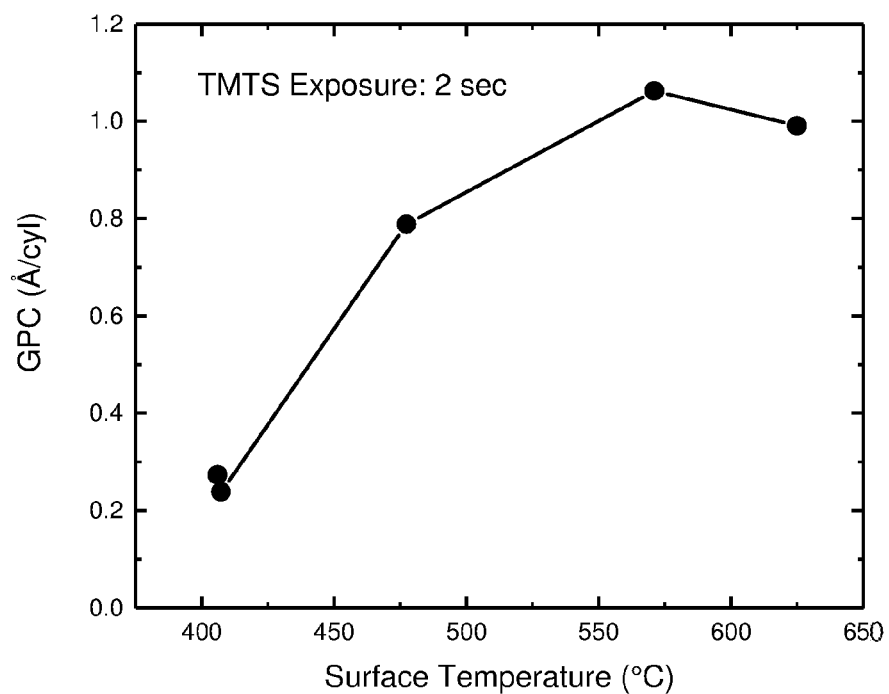
Figure 6: Measured ALD Window for a 2 sec exposure of TMTS followed by 2.5 sec cumulative exposure to $O_3$ (5 consecutive 0.5 sec pulses).

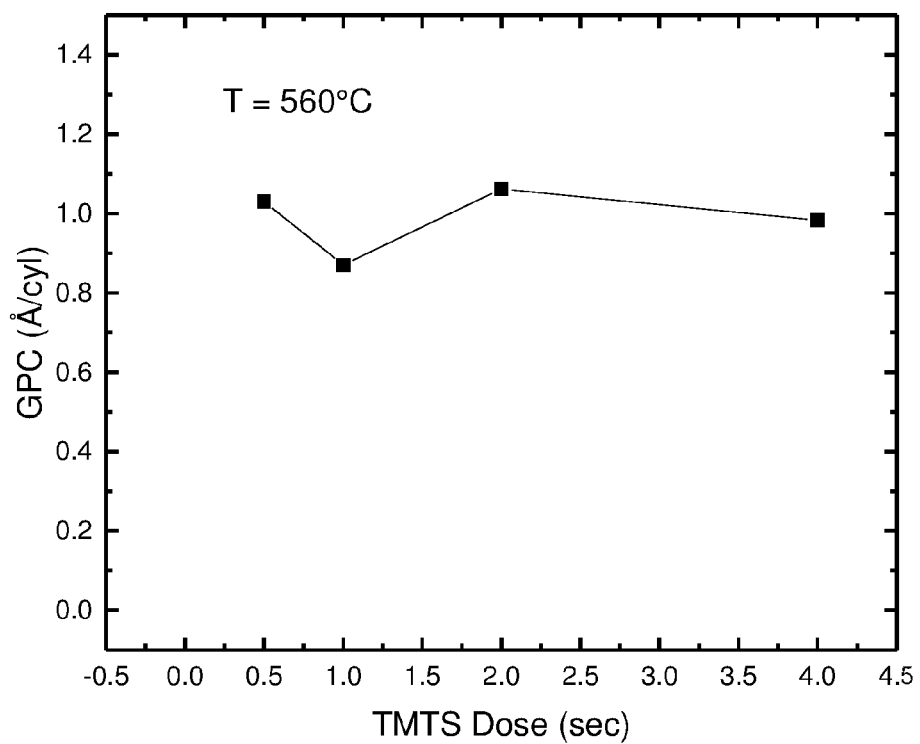
Figure 7: Measured Saturation Curve for TMTS and $O_3$. The curve is obtained by holding the substrate temperature fixed and increasing the exposure time of TMTS. The ozone step at 2.5 sec cumulative dose was found to be in saturation.

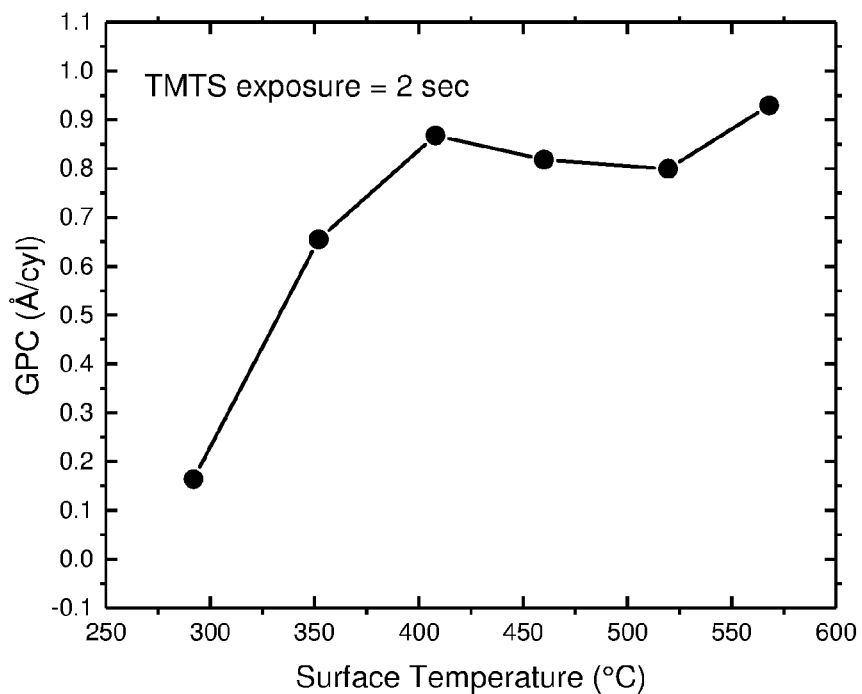
Figure 8: PEALD Window of TMTS and NH$_3$ Plasma to grow a SiN thin film. The TMTS was introduced to the substrate in a 2 second injection, followed by a 10 second NH3 plasma held at 300W. Ar was used to purge between reactants.

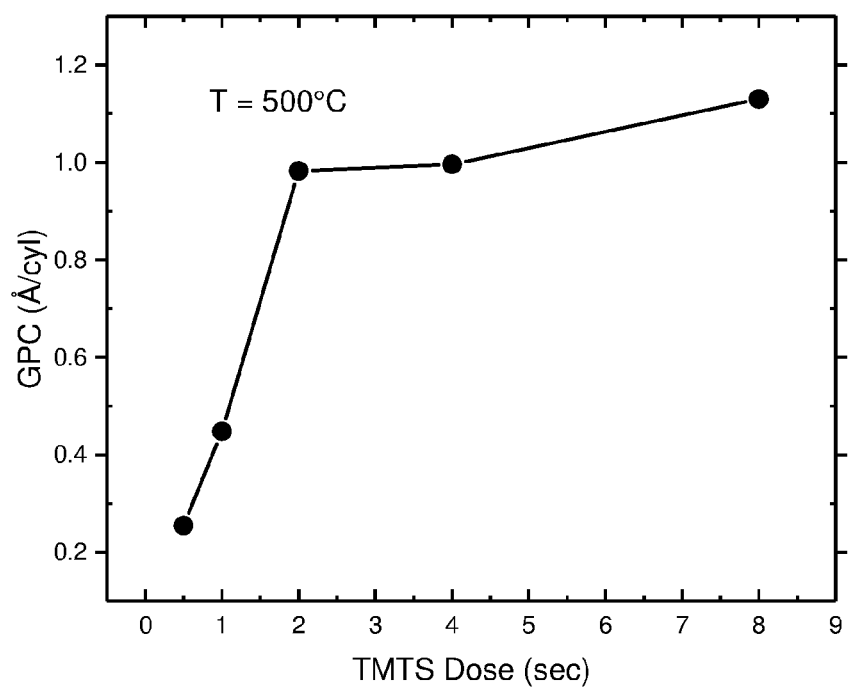
Figure 9: Saturation Curve for TMTS and NH3 Plasma. The substrate temperature was held constant at 500°C.

THIO(DI)SILANES

CROSS-REFERENCE TO RELATED APPLICATIONS

This application is the National Stage of International Application No. PCT/US2017/055857 filed on 10 Oct. 2017, which claims priority to and all advantages of U.S. Provisional Appl. No. 62/407,008 filed on 12 Oct. 2016, the contents of which are hereby incorporated by reference.

This invention generally relates to methods of forming silicon-containing films using particular thio(di)silane compounds in chemical vapor deposition (CVD) or atomic layer deposition (ALD) processes and the films formed.

Elemental silicon and silicon compounds with one or more of oxygen, carbon, or nitrogen have a variety of uses. For example, a film composed of elemental silicon, silicon oxide, silicon carbide, silicon nitride, silicon carbonitride, or silicon oxycarbonitride may be used as a semiconductor, an insulating layer or a sacrificial layer in the manufacture of electronic circuitry for electronic or photovoltaic devices.

Known methods of preparing the silicon material may use one or more silicon-yielding precursor materials using processes such as chemical vapor deposition or atomic layer deposition processes. Use of these precursors is not limited to making silicon for electronic or photovoltaic applications.

Despite decades of research, however, most designers of silicon-yielding precursors have avoided sulfur-containing moieties. We believe this is due in part to their perception that sulfur-containing silicon compounds are unsuitable as precursors due to difficulties with synthesizing sulfur-containing silicon compounds and due to molecular instability of conventional sulfur-containing silicon compounds. We see a long-felt unmet need in the electronics and photovoltaic industries for methods of forming silicon-containing films using improved silicon-yielding precursors. If the problems with sulfur could be overcome, we think methods of depositing silicon-containing films using sulfur-containing silicon-yielding precursors having one or more sulfur atoms per molecule would enable making new silicon films and silicon sulfide materials. New methods using sulfur-containing silicon-yielding precursors might also enable lowering of deposition temperatures and making finer semiconductor features for better performing electronic and photovoltaic devices. We sought new and improved methods of depositing silicon-containing films using sulfur-containing silicon compounds. Ideally, the methods will use sulfur-containing silicon compounds that are molecularly stable in neat form (purity≥95% to 100%) at storage and transportation temperatures (e.g., 20° to 30° C.).

BRIEF SUMMARY OF THE INVENTION

We have discovered films and materials prepared therefrom, and methods of making the films and materials prepared therefrom using thio(di)silane compounds. The inventive method employs thio(di)silane compounds include thiosilane compounds having one silicon atom and one or more sulfur atoms per molecule and thiodisilane compounds having two silicon atoms and one or more sulfur atoms per molecule. Unlike prior sulfur-containing silane compounds, the inventive method employs thio(di)silane compounds that are molecularly stable at ambient temperature, where decomposition thereof is inhibited or prevented. Thus, neat forms (purity≥95% to 100%) of the thio(di)silanes may be stored and transported. The molecular stability of the thio(di)silane compounds used in the method is due to their improved structures. The design principles used to configure the structures of the thiosilane compounds used in the inventive method are the same as the design principles used to configure the structures of the thiodisilane compounds used, although due to structural differences between silanes (one Si, also called monosilanes) and disilanes (Si—Si), the results are somewhat different. The thio(di)silane compounds are useful as silicon-yielding precursors and are used as such in the inventive chemical vapor deposition and atomic layer deposition processes.

The inventive methods using thio(di)silanes are for making silicon-containing films. The silicon-containing films are useful in (opto)electronic and photovoltaic devices. The invention method may have additional uses unrelated to these applications.

BRIEF DESCRIPTION OF THE DRAWINGS

FIG. 1 is a graph of the film growth per cycle versus surface temperature for a process of growing a silicon oxide film using bis(tertbutylthio)silane and ozone in an atomic layer deposition process.

FIG. 2 is a graph depicting the saturation curve for a process of growing a silicon oxide film using bis(tertbutylthio)silane and ozone in an atomic layer deposition process.

FIG. 3 is a graph of the film growth per cycle versus surface temperature for a process of growing a silicon nitride film using bis(tertbutylthio)silane and ammonia plasma in an plasma enhanced atomic layer deposition process.

FIG. 4 is a graph depicting the saturation curve for a process of growing a silicon nitride film using bis(tertbutylthio)silane and ammonia plasma in an plasma enhanced atomic layer deposition process.

FIG. 5 is a graph of the film growth per cycle versus surface temperature for a process of growing a silicon nitride film using bis(tertbutylthio)silane and ammonia in a chemical vapor deposition process.

FIG. 6 is a graph of the film growth per cycle versus surface temperature for a process of growing a silicon oxide film using tris(methanethio)silane and ozone in an atomic layer deposition process.

FIG. 7 is a graph depicting the saturation curve for a process of growing a silicon oxide film using tris(methanethio)silane and ozone in an atomic layer deposition process.

FIG. 8 is a graph of the film growth per cycle versus surface temperature for a process of growing a silicon nitride film using tris(methanethio)silane and ammonia plasma in an plasma enhanced atomic layer deposition process.

FIG. 9 is a graph depicting the saturation curve for a process of growing a silicon nitride film using tris(methanethio)silane and ammonia plasma in an plasma enhanced atomic layer deposition process.

DETAILED DESCRIPTION OF THE INVENTION

The Brief Summary and Abstract are incorporated here by reference. Some embodiments of the invention include the following numbered aspects.

Aspect 1. A method of forming a silicon-containing film on a substrate, the method comprising, heating the thiodisilane of formula (I): $(R^{1a}R^{1b}R^{1c}CS)_s(R^2{}_2N)_n(Si-Si)X_xH_h$ (I), wherein: subscript s is an integer from 1 to 6; subscript n is an integer from 0 to 5; subscript x is an integer from 0 to 5; subscript h is an integer from 0 to 5; with the proviso that sum s+n+x+h=6; each H, when present in formula (I)

(i.e., when subscript h is 1 to 5), is independently bonded to the same or different one of the silicon atoms in formula (I); each X is a monovalent halogen atom F, Cl, Br, or I and, when present in formula (I) (i.e., when subscript x is 1 to 5), is independently bonded to the same or different one of the silicon atoms in formula (I); wherein $R^{1a}$, $R^{1b}$, and $R^{1c}$ are defined by limitation (a), (b), or (c): (a) at least one $R^{1a}$ independently is $(C_2-C_{20})$alkyl or phenyl and each of any remaining $R^{1a}$, $R^{1b}$, and $R^{1c}$ independently is H or $(C_1-C_{20})$hydrocarbyl; or (b) there is at least one group $R^{1a}R^{1b}R^{1c}C$ that independently is a substituted $(C_6-C_{20})$aryl and each of any remaining $R^{1a}$, $R^{1b}$, and $R^{1c}$ independently is H or $(C_1-C_{20})$hydrocarbyl; or (c) any two of $R^{1a}$, $R^{1b}$, and $R^{1c}$ (collectively $R^1$ groups), in the same or different $R^{1a}R^{1b}R^{1c}C$ group, are bonded together to form a divalent group, —$R^{11}$—, wherein —$R^{11}$— is a $CH_2$ or a $(C_3-C_{20})$hydrocarbylene and each of any remaining $R^{1a}$, $R^{1b}$, and $R^{1c}$ independently is H or $(C_1-C_{20})$hydrocarbyl; each $R^2$ group independently is H or a $(C_1-C_{20})$hydrocarbyl; or any two $R^2$ groups may be bonded together to form a divalent group, —$R^{22}$—, wherein —$R^{22}$— is a $(C_2-C_{20})$hydrocarbylene and each of any remaining $R^2$ groups independently is H or a $(C_1-C_{20})$hydrocarbyl; each hydrocarbyl and hydrocarbylene independently is unsubstituted or substituted with from 1 to 5 substituents SUB; and each SUB independently is unsubstituted $(C_1-C_6)$alkyl, unsubstituted $(C_3-C_6)$cycloalkyl, unsubstituted $(C_2-C_6)$alkenyl, unsubstituted $(C_2-C_6)$alkynyl, unsubstituted $(C_6-C_7)$aryl, fluoro, chloro, bromo, or iodo, in a chemical vapor deposition (CVD) or atomic layer deposition (ALD) process under thermal or plasma conditions to give a silicon-containing film disposed on the substrate. Alternatively, s is 1 to 5, alternatively s is 1 to 4, alternatively s is 1 to 3, alternatively s is 1 or 2, alternatively s is 2 to 6, alternatively s is 2 to 5, alternatively s is 2 to 4, alternatively s is 2 or 3, alternatively s is 1; alternatively s is 2, alternatively s is 3, alternatively s is 4, alternatively s is 5, alternatively s is 6. Each $R^{1a}R^{1b}R^{1c}CS$ group is independently bonded at its sulfur atom to the same or different one of the silicon atoms in formula (I). In some embodiments at least one, alternatively each $R^{1a}R^{1b}R^{1c}CS$ group is a monovalent group (having a radical at S). Alternatively, at least one, alternatively each $R^{1a}R^{1b}R^{1c}CS$ group is a divalent group (having a first radical at S and a second radical at either C or $R^{1a}$). The group $R^{1a}R^{1b}R^{1c}C$ that independently is a substituted $(C_6-C_{20})$aryl means $R^{1a}$, $R^{1b}$, and $R^{1c}$ taken together with the carbon atom C form a substituted $(C_6-C_{20})$aryl. Each $R^2{}_2N$ group, when present in formula (I) (i.e., when subscript n is 1 to 5), is independently bonded at its nitrogen atom to the same or different one of the silicon atoms in formula (I). In some embodiments at least one, alternatively each $R^2{}_2N$ group is a monovalent group (having a radical at N). Alternatively, at least one, alternatively each $R^2{}_2N$ group is a divalent group (having a first radical at N and a second radical at either N or at $R^2$). In some embodiments, any aspect of the thiodisilane of formula (I) may be characterized as being in neat form, having a purity from ≥95% to 100%. The neat form of any such aspect of the thiodisilane of formula (I) may be molecularly stable at ambient storage and transportation temperatures (e.g., 20° to 30° C.).

Aspect 2. The method of aspect 1 wherein: subscript s is an integer from 1 to 4; subscript n is an integer from 0 to 2; subscript x is an integer from 0 to 2; subscript h is an integer from 0 to 2; with the proviso that sum s+n+x+h=6; and wherein X, $R^{1a}$, $R^{1b}$, $R^{1c}$, and $R^2$ are as defined above for formula (I). Alternatively, s is 1 to 3, alternatively s is 1 or 2, alternatively s is 1; alternatively s is 2, alternatively s is 3, alternatively s is 4.

Aspect 3. The method of aspect 1 wherein subscript s is an integer from 1 to 4; each of subscripts n and x is 0; subscript h is 2 to 5; with the proviso that sum s+h=6; and wherein $R^{1a}$, $R^{1b}$, and $R^{1c}$ are as defined above for formula (I). Alternatively, s is 1 to 3, alternatively s is 1 or 2, alternatively s is 1; alternatively s is 2, alternatively s is 3, alternatively s is 4.

Aspect 4. The method of aspect 1, wherein subscript s is an integer from 1 to 4; each of subscripts n and h independently is from 1 to 5; subscript x is 0; with the proviso that sum s+n+h=6; and wherein $R^{1a}$, $R^{1b}$, $R^{1c}$, and $R^2$ are as defined above for formula (I). Alternatively, s is 1 to 3, alternatively s is 1 or 2, alternatively s is 1; alternatively s is 2, alternatively s is 3, alternatively s is 4.

Aspect 5. The method of aspect 1 wherein subscript s is an integer from 1 to 4; each of subscripts n and h is 0; subscript x is 2 to 5; with the proviso that sum s+x=6; and wherein X, $R^{1a}$, $R^{1b}$, and $R^{1c}$ are as defined above for formula (I). Alternatively, s is 1 to 3, alternatively s is 1 or 2, alternatively s is 1; alternatively s is 2, alternatively s is 3, alternatively s is 4.

Aspect 6. The method of aspect 1, wherein subscript s is an integer from 1 to 4; each of subscripts x and h independently is from 1 to 5; subscript n is 0; with the proviso that sum s+x+h=6; and wherein X, $R^{1a}$, $R^{1b}$, and $R^{1c}$ are as defined above for formula (I). Alternatively, s is 1 to 3, alternatively s is 1 or 2, alternatively s is 1; alternatively s is 2, alternatively s is 3, alternatively s is 4.

Aspect 7. The method of any one of aspects 1-6 wherein subscript s is 1 or 2.

Aspect 8. The method of any preceding aspect wherein each X is F, Cl, or Br; and each $(C_1-C_{20})$hydrocarbyl independently is $(C_1-C_{20})$alkyl, $(C_2-C_{20})$alkenyl, $(C_2-C_{20})$alkynyl, $(C_3-C_{20})$cycloalkyl, or $(C_6-C_{20})$aryl; or any two $(C_1-C_{20})$hydrocarbyl groups may be bonded together to form a divalent group that is a $(C_1-C_{20})$alkylene, $(C_2-C_{20})$alkenylene, $(C_2-C_{20})$alkynylene, or $(C_6-C_{20})$arylene.

Aspect 9. The method of any preceding aspect wherein each X is Cl and each $(C_1-C_{20})$hydrocarbyl independently is a $(C_1-C_{12})$hydrocarbyl, a $(C_1-C_8)$hydrocarbyl, or a $(C_3-C_8)$hydrocarbyl. Alternatively each X is Cl. Alternatively, each hydrocarbyl is an unsubstituted alkyl, a substituted alkyl, an unsubstituted aryl, or an alkyl-substituted aryl. Alternatively or additionally, at least one $(C_1-C_{20})$hydrocarbyl independently is unsubstituted or substituted $(C_1-C_5)$alkyl or unsubstituted or substituted phenyl. Alternatively or additionally, at least one $(C_1-C_{20})$hydrocarbyl independently is unsubstituted $(C_1-C_5)$alkyl, phenyl, or substituted phenyl.

Aspect 10. The method of aspect 9 wherein each hydrocarbyl is an unsubstituted alkyl, a substituted alkyl, an unsubstituted aryl, or an alkyl-substituted aryl.

Aspect 11. The method of aspect 1 of formula (I-a): $(R^{1a}R^{1b}R^{1c}CS)_s(Si-Si)H_h$ (I-a), wherein: subscript s is an integer from 1 to 6; subscript h is an integer from 0 to 5; with the proviso that sum s+h=6; and wherein $R^{1a}$, $R^{1b}$, and $R^{1c}$ are as defined above for formula (I). Alternatively, s is 1 to 5, alternatively s is 1 to 4, alternatively s is 1 to 3, alternatively s is 1 or 2, alternatively s is 2 to 6, alternatively s is 2 to 5, alternatively s is 2 to 4, alternatively s is 2 or 3, alternatively s is 1; alternatively s is 2, alternatively s is 3, alternatively s is 4, alternatively s is 5, alternatively s is 6.

Aspect 12. The method of aspect 11 wherein subscript s is an integer from 1 to 3; subscript h is an integer from 3 to 5; and each $(C_1-C_{20})$hydrocarbyl independently is an unsubstituted $(C_1$-$C_6)$alkyl, substituted $(C_1$-$C_6)$alkyl, unsubstituted aryl, or a $(C_1$-$C_3)$alkyl-substituted $(C_6)$aryl.

Aspect 13. The method of aspect 12 wherein the thiodisilane is selected from: (1,1-dimethylethylthio)disilane; (phenylthio)disilane; (2-methyl-phenylthio)disilane; (2,6-dimethyl-phenylthio)disilane; (benzylthiol)disilane; and (1,2-dimethylpropylthio)disilane.

Aspect 14. The method of aspect 12 where the thiodisilane is selected from: 1,2-bis(1,1-dimethylethylthio)disilane; 1,1-di(phenylthio)disilane; 1,2-bis(2-methyl-phenylthio)disilane; 1,2-bis(2,6-dimethyl-phenylthio)disilane; 1,2-bis(benzylthiol)disilane; and 1,2-bis(1,2-dimethylpropylthio)disilane.

Aspect 15. The method of any preceding aspect wherein the thiodisilane further being a liquid and/or having a predicted boiling point of from 100 degrees Celsius (° C.) to less than 400° C., wherein the predicted boiling point is determined according to Boiling Point Test Method 1.

Aspect 16. The thiodisilane may be synthesized by contacting an aminodisilane of formula (II): $(R^2_2N)_{(n+s)}(Si—Si)H_h$ (11) with an organothiol of formula (III): $R^{1a}R^{1b}R^{1c}CSH$ (III) to give a thiodisilane of formula (IV): $(R^{1a}R^{1b}R^{1c}CS)_s(R^2_2N)_n(Si—Si)H_h$ (IV), wherein: subscript s is an integer from 1 to 6; subscript n is an integer from 0 to 5; subscript h is an integer from 0 to 5; with the proviso that sum s+n+h=6; each H, when present in formula (IV) (i.e., when subscript h is 1 to 5), is independently bonded to the same or different one of the silicon atoms in formulas (IV); wherein $R^{1a}$, $R^{1b}$, and $R^{1c}$ are defined by limitation (a), (b), or (c): (a) at least one $R^{1a}$ independently is $(C_2$-$C_{20})$alkyl and each of any remaining $R^{1a}$, $R^{1b}$, and $R^{1c}$ independently is H or $(C_1$-$C_{20})$ hydrocarbyl; or (b) there is at least one group $R^{1a}R^{1b}R^{1c}C$ that independently is a substituted $(C_6$-$C_{20})$aryl and each of any remaining $R^{1a}$, $R^{1b}$, and $R^{1c}$ independently is H or $(C_1$-$C_{20})$hydrocarbyl; or (c) any two of $R^{1a}$, $R^{1b}$, and $R^{1c}$ (collectively $R^1$ groups), in the same or different $R^{1a}R^{1b}R^{1c}$ group, are bonded together to form a divalent group, —$R^{11}$—, wherein —$R^{11}$— is a $CH_2$ or a $(C_3$-$C_{20})$ hydrocarbylene and each of any remaining $R^{1a}$, $R^{1b}$, and $R^{1c}$ independently is H or $(C_1$-$C_{20})$hydrocarbyl; each $R^2$ group independently is H or a $(C_1$-$C_{20})$hydrocarbyl; or any two $R^2$ groups may be bonded together to form a divalent group, —$R^{22}$—, wherein —$R^{22}$— is a $(C_2$-$C_{20})$hydrocarbylene and each of any remaining $R^2$ groups independently is H or a $(C_1$-$C_{20})$hydrocarbyl; each hydrocarbyl and hydrocarbylene independently is unsubstituted or substituted with from 1 to 5 substituents SUB; and each SUB independently is unsubstituted $(C_1$-$C_5)$alkyl, unsubstituted $(C_3$-$C_5)$cycloalkyl, unsubstituted $(C_2$-$C_5)$alkenyl, unsubstituted $(C_2$-$C_5)$alkynyl, unsubstituted $(C_6$-$C_7)$aryl, fluoro, chloro, or bromo. Alternatively, the thiodisilane is of any one of aspects 1 to 15. Each $R^{1a}R^{1b}R^{1c}CS$ group is independently bonded at its sulfur atom to the same or different one of the silicon atoms in formula (IV). In some embodiments at least one, alternatively each $R^{1a}R^{1b}R^{1c}CS$ group is a monovalent group (having a radical at S). Alternatively, at least one, alternatively each $R^{1a}R^{1b}R^{1c}CS$ group is a divalent group (having a first radical at S and a second radical at either C or $R^{1a}$). The group $R^{1a}R^{1b}R^{1c}C$ that independently is a substituted $(C_6$-$C_{20})$aryl means $R^{1a}$, $R^{1b}$, and $R^{1c}$ taken together with the carbon atom C form a substituted $(C_6$-$C_{20})$aryl. Each $R^2_2N$ group in formula (II) and, when present, in formula (IV) (i.e., when subscript n is 1 to 5), is independently bonded at its nitrogen atom to the same or different one of the silicon atoms in formula (II) or (IV), respectively. In some embodiments at least one, alternatively each $R^2_2N$ group is a monovalent group (having a radical at N). Alternatively, at least one, alternatively each $R^2_2N$ group is a divalent group (having a first radical at N and a second radical at either N or at $R^2$). In some embodiments, the method of synthesizing the thiodisilane of formula (I) further comprises a step of purifying same to give the thiodisilane of formula (I) in neat form, having a purity from ≥95% to 100%. The step of purifying may comprise any suitable separation or purification method such as the methods described later. E.g., any one or more of chromatography, extracting, stripping, evaporating, distilling, fractionally distilling, crystallizing, and decanting. In some embodiments the purifying step comprises fractionally distilling the thiodisilane of formula (I).

Aspect 17. The method of synthesizing of aspect 16 wherein subscript n is 0 in formula (IV), the method comprising contacting an aminodisilane of formula (II-a): $(R^2_2N)_s(Si—Si)H_h$ (II-a) with s mole equivalents, relative to moles of the aminodisilane, of the organothiol of formula (III): $R^{1a}R^{1b}R^{1c}CSH$ (III) to give a thiodisilane of formula (IV-a): $(R^{1a}R^{1b}R^{1c}CS)_s(Si—Si)H_h$ (IV-a), Wherein: subscript s is an integer from 1 to 6; subscript h is an integer from 0 to 5; with the proviso that sum s+h=6; and wherein $R^{1a}$, $R^{1b}$, $R^{1c}$, and $R^2$ are as defined above for formula (IV).

Aspect 18. The method of synthesizing of 16 or 17 wherein s is 1 and h is 5.

Aspect 19. The method of synthesizing of any one of aspects aspect 16 to 18 wherein each $R^{1a}$, $R^{1b}$, and $R^{1c}$ independently is an unsubstituted $(C_1$-$C_6)$alkyl, substituted $(C_1$-$C_6)$alkyl, unsubstituted aryl, or a $(C_1$-$C_3)$alkyl-substituted $(C_6)$aryl; and each $R^2$ independently is an unsubstituted $(C_1$-$C_6)$alkyl or unsubstituted $(C_3$-$C_6)$cycloalkyl; or two $R^2$ are bonded together to form, —$R^{22}$—, wherein —$R^{22}$— is an unsubstituted $(C_2$-$C_6)$alkylene.

Aspect 20. The method of synthesizing of any one of aspects 16 to 19 wherein the thiodisilane of formula (IV) is a liquid and/or has a predicted boiling point of from 100 degrees Celsius (° C.) to less than 400° C., wherein the predicted boiling point is determined according to Boiling Point Test Method 1.

Aspect 21. A method of forming silicon-containing film, the method comprising: heating a thiosilane of formula (A): $(R^{1a}R^{1b}R^{1c}CS)_s(Si)X_xH_h$ (A), Wherein: subscript s is an integer from 1 to 4, alternatively from 2 to 4; subscript x is an integer from 0 to 3, alternatively from 0 to 3; subscript h is an integer from 0 to 3, alternatively from 0 to 2; with the proviso that sum s+x+h=4; each X is a monovalent halogen atom F, Cl, or Br; wherein $R^{1a}$, $R^{1b}$, and $R^{1c}$ are defined by limitation (a), (b), or (c): (a) $R^{1a}$ is $(C_1$-$C_6)$alkyl, $R^{1b}$ is $(C_2$-$C_6)$alkyl or H, and $R^{1c}$ is H; or (b) each of $R^{1a}$, $R^{1b}$, and $R^{1c}$ independently is $(C_1$-$C_6)$alkyl; (c) $R^{1a}R^{1b}R^{1c}C$ together represents a substituted or unsubstituted phenyl group, wherein the substitute groups on the phenyl are one or more methyl groups; each alkyl independently is unsubstituted or substituted with from 1 to 5 substituents SUB; and each SUB independently is unsubstituted $(C_1$-$C_6)$alkyl, unsubstituted $(C_3$-$C_6)$cycloalkyl, unsubstituted $(C_2$-$C_6)$alkenyl, unsubstituted $(C_2$-$C_6)$alkynyl, unsubstituted $(C_6$-$C_7)$aryl, fluoro, chloro, bromo, or iodo, in a chemical vapor deposition (CVD) or atomic layer deposition (ALD) process under thermal or plasma conditions to give a silicon-containing film disposed on the substrate. Alternatively, s is 2 or 3, alternatively s is 2 or 4, alternatively s is 3 or 4, alternatively s is 1 or 2, alternatively s is 2, alternatively s is 3, alternatively s is 4. Each $R^{1a}R^{1b}R^{1c}C_s$ group is bonded at its sulfur atom to the silicon atom in formula (A). In some embodiments at least one, alternatively each $R^{1a}R^{1b}R^{1c}CS$ group is a monovalent group (having a radical at S). Alternatively, at least one, alternatively each $R^{1a}R^{1b}R^{1c}CS$ group is a divalent group (having a radical at S and at either C or $R^{1a}$). In some embodiments, any aspect of the thiosilane of formula (A) may be characterized as being in neat form, having a purity from ≥95% to 100%. The neat form of any such aspect of the thiosilane of formula (A) may be molecularly stable at ambient storage and transportation temperatures (e.g., 20° to 30° C.).

Aspect 22. The method of aspect 21 wherein s is 2, x is 2, and h is 0.

Aspect 23. The method of aspect 21 or 22 wherein $R^{1a}$ is $(C_1-C_6)$alkyl, $R^{1b}$ is $(C_3-C_6)$alkyl, and $R^{1c}$ is H. Alternatively each alkyl is unsubstituted.

Aspect 24. The method of aspect 23 wherein $R^{1a}$ is $(C_1-C_2)$alkyl, $R^{1b}$ is $(C_3-C_4)$alkyl, and $R^{1c}$ is H. Alternatively each alkyl is unsubstituted.

Aspect 25. The method of aspect 21 or 22 wherein each of $R^{1a}$, $R^{1b}$, and $R^{1c}$ independently is $(C_1-C_6)$alkyl. Alternatively each alkyl is unsubstituted.

Aspect 26. The method of aspect 25 wherein each of $R^{1a}$, $R^{1b}$, and $R^{1c}$ independently is $(C_1-C_2)$alkyl. Alternatively each alkyl is unsubstituted.

Aspect 27. Bis(1,1-dimethylethylthio)silane; Bis(1,2-dimethylpropylthio)silane; or Dichloro-bis(1,2-dimethylpropylthio)silane.

Aspect 28. The method of any one of aspects 21-27 the thiosilane further being a liquid and/or having a predicted boiling point of from 100 degrees Celsius (° C.) to less than 400° C., wherein the predicted boiling point is determined according to Boiling Point Test Method 1.

Aspect 29. The thiosilane may be synthesized by contacting an aminosilane of formula (B): $(R^2_2N)_s(Si)H_h$ (B) with an organothiol of formula (C): $R^{1a}R^{1b}R^{1c}CSH$ (C) to give a thiosilane of formula (D): $(R^{1a}R^{1b}R^{1c}CS)_s(Si)H_h$ (D), Wherein: subscript s is an integer from 1 to 4, alternatively from 2 to 4; subscript h is an integer from 0 to 3, alternatively 0 to 2; with the proviso that sum s+h=4; each $R^2$ group independently is H or a $(C_1-C_{20})$hydrocarbyl; or any two $R^2$ groups may be bonded together to form a divalent group, $—R^{22}—$, wherein $—R^{22}—$ is a $(C_2-C_{20})$hydrocarbylene and each of any remaining $R^2$ groups independently is H or a $(C_1-C_{20})$hydrocarbyl; wherein $R^{1a}$, $R^{1b}$, and $R^{1c}$ are defined by limitation (a) or (b): (a) $R^{1a}$ is $(C_1-C_6)$alkyl, $R^{1b}$ is $(C_2-C_6)$alkyl, and $R^{1c}$ is H; or (b) each of $R^{1a}$, $R^{1b}$, and $R^{1c}$ independently is $(C_1-C_6)$alkyl; each alkyl independently is unsubstituted or substituted with from 1 to 5 substituents SUB; and each SUB independently is unsubstituted $(C_1-C_6)$ alkyl, unsubstituted $(C_3-C_6)$cycloalkyl, unsubstituted $(C_2-C_6)$alkenyl, unsubstituted $(C_2-C_6)$alkynyl, unsubstituted $(C_6-C_7)$aryl, fluoro, chloro, or bromo. Alternatively, the thiosilane is any one of aspects 21 to 28. Each $R^2_2N$ group is bonded at its nitrogen atom to the silicon atom in formula (B). In some embodiments at least one, alternatively each $R^2_2N$ group is a monovalent group (having a radical at N). Alternatively, at least one, alternatively each $R^2_2N$ group is a divalent group (having a first radical at N and a second radical at either N or at $R^2$). Each $R^{1a}R^{1b}R^{1c}CS$ group is bonded at its sulfur atom to the silicon atom in formula (D). In some embodiments at least one, alternatively each $R^{1a}R^{1b}R^{1c}CS$ group is a monovalent group (having a radical at S). Alternatively, at least one, alternatively each $R^{1a}R^{1b}R^{1c}CS$ group is a divalent group (having a first radical at S and second radical at either C or $R^{1a}$). In some embodiments, the method of synthesizing the thiosilane of formula (D) further comprises a step of purifying same to give the thiosilane of formula (D) in neat form, having a purity from ≥95% to 100%. The step of purifying may comprise any suitable separation or purification method such as the methods described later. E.g., any one or more of chromatography, extracting, stripping, evaporating, distilling, fractionally distilling, crystallizing, and decanting. In some embodiments the purifying step comprises fractionally distilling the thiosilane of formula (D).

Aspect 30. The method of synthesizing of Aspect 29 wherein s is 2 and h is 2.

Aspect 31. The method of synthesizing of aspect 29 or 30 wherein $R^{1a}$ is $(C_1-C_6)$alkyl, $R^{1b}$ is $(C_3-C_6)$alkyl, and $R^{1c}$ is H; or wherein $R^{1a}$ is $(C_1-C_2)$alkyl, $R^{1b}$ is $(C_3-C_4)$alkyl, and $R^{1c}$ is H; or wherein each of $R^{1a}$, $R^{1b}$, and $R^{1c}$ independently is $(C_1-C_6)$alkyl; or wherein each of $R^{1a}$, $R^{1b}$, and $R^{1c}$ independently is $(C_1-C_2)$alkyl.

Aspect 32. The method of aspect 29 wherein the aminosilane of formula (B) is bis(di($C_2-C_6$)alkylamino)silane, the organothiol of formula (C) is 1,1-dimethylethylthiol or 1,2-dimethylpropylthiol and the thiosilane of formula (D) is bis(1,1-dimethylethylthio)silane or bis(1,2-dimethylpropylthio)silane.

Aspect 33. A method of synthesizing silicon disulfide of formula $SiS_x$, the method comprising heating a mono-, di-, tri, or tetrathio(di)silane, alternatively a di-, tri, or tetrathio(di)silane, alternatively a dithio(di)silane, alternatively tetramethanethiosilane, under cracking conditions comprising a reaction temperature so as to decompose the thio(di)silane to give silicon sulfide of formula $SiS_x$, where x is 1 or greater, alternatively 2 or greater, alternatively 2-9, alternatively 2, and a by-product, wherein the silicon disulfide and the by-product have different compositions and wherein the thio(di)silane is the thiodisilane of any one of aspects 1-15 or the thiosilane of any one of aspects 21-28.

Aspect 34. A method of depositing a silicon-containing film on a substrate, the method comprising the method of any one of aspects 1-15 or 21-28 and further comprising heating a co-reactant in the chemical vapor deposition (CVD) or atomic layer deposition (ALD) process under thermal or plasma conditions to give a silicon-containing film disposed on the substrate. Alternatively, the method comprises the CVD process, alternatively the ALD process.

Aspect 35. A method of depositing a silicon-containing film on a substrate, the method comprising heating a co-reactant and a thio(di)silane in a chemical vapor deposition (CVD) or atomic layer deposition (ALD) process under thermal or plasma conditions to give a silicon-containing film disposed on the substrate; wherein the thio(di)silane is a thiodisilane selected from the group consisting of: methylthio-disilane; 1,2-Bis(phenylthio)-disilane; 1,4-Dithia-2,3-disilacyclohexane; 2,2,3,3,-Tetramethyl-1,4-dithia-2,3-disilacyclohexane; 2,3-Dihydro-2,2,3,3,-tetramethyl-1,4,2,3-benzodithiadisilane; 1,1,2,2-Tetramethyl-1,2-bis(methylthio)-disilane; 1,1,2,2-Tetramethyl-1,2-bis(ethylthio)-disilane; 1,1,2,2-Tetramethyl-1,2-bis(propylthio)-disilane; 1,1,2,2-Tetramethyl-1,2-bis(butylthio)-disilane; 1-Chloro-,1,2,2-trimethyl-1,2-bis(butylthio)-disilane; 1,2-Bis(butylthio)-1,2-dichloro-1,2-dimethyl-disilane; 1,2-Bis[(1,1-dimethylethyl)thio]-1,1,2,2-tetramethyl-disilane; 1,2-Dichloro-1,2-bis[(1,1-dimethylethyl)thio]-1,2-dimethyl-disilane; and Dihydro-2,2,4,6,6,8-hexamethyl-[1,4,2,3]dithiadisilolo[2,3-b][1,4,2,3] dithiadisilole. Alternatively, the thiodisilane is selected from the group consisting of all but any one of the preceding named thiodisilanes. Alternatively, the thiodisilane is a combination of any two of the preceding named thiodisilanes.

Aspect 36. A method of depositing a silicon-containing film on a substrate, the method comprising heating a co-reactant and a thio(di)silane in a chemical vapor deposition (CVD) or atomic layer deposition (ALD) process under thermal or plasma conditions to give a silicon-containing film disposed on the substrate; wherein the thio(di)silane is a thiosilane selected from the group consisting of: Tri(methylthio)silane; Tri(ethylthio)silane; Tri(propylthio)silane; Tri(1-methylethylthio)silane; Trichloro-(ethylthio)silane; Trichloro-(butylthio)silane; Trichloro-(1,1-dimethylethylthio)silane; Dichloro-di(ethylthio)silane; Dichloro-di(butylthio)silane; Dichloro-di(1,1-dimethylethylthio)silane; Chloro-tri(methylthio)silane; Chloro-tri(ethylthio)silane; Chloro-tri(propylthio)silane; Chloro-tri(1-methylethylthio)silane; Tetra(methylthio)silane; Tetra(ethylthio)silane; Tetra(propylthio)silane; and Tetra(1-methylethylthio)silane. Alternatively, the thiosilane is selected from the group consisting of all but any one of the preceding named thiosilanes. Alternatively, the thiosilane is a combination of any two of the preceding named thiosilanes.

Aspect 37. The method of aspect 34, 35, or 36 wherein the co-reactant comprises hydrogen sulfide or hydrogen disulfide and the film comprises a silicon sulfide; wherein the co-reactant comprises ammonia, molecular nitrogen, or hydrazine and the film comprises a silicon nitride; wherein the co-reactant comprises an organohydrazine, an amine, or an imine and the film comprises a silicon carbonitride; wherein the co-reactant comprises molecular oxygen, ozone, water, or hydrogen peroxide and the film comprises a silicon oxide; wherein the co-reactant comprises nitric oxide or nitrogen dioxide and the film comprises a silicon oxynitride; wherein the co-reactant comprises an alcohol and the film comprises a silicon oxycarbonitride.

Aspect 38. The method of aspect 1-15, 21-28, 34, 35, 36, or 37 wherein the CVD process comprises a plasma-enhanced chemical vapor deposition (PECVD) process, a low-pressure chemical vapor deposition (LPCVD) process, a cyclic chemical vapor deposition (cyclic CVD) process, an atmospheric-pressure chemical vapor deposition (APCVD) process, a metal-organic chemical vapor deposition (MOCVD) process, a flowable chemical vapor deposition (FCVD) process, a high density-plasma chemical vapor deposition (HDPCVD) process, or a hot-filament chemical vapor deposition (HFCVD) process; and wherein the ALD process comprises a plasma-enhanced atomic layer deposition (PEALD) process or a spatial atomic layer deposition (spatial ALD) process. Alternatively, the method comprises the CVD process, wherein the CVD process is the PECVD process, alternatively the LPCVD process, alternatively the cyclic CVD process, alternatively the APCVD process, alternatively the MOCVD process, alternatively the FCVD process, alternatively the HDPCVD process, alternatively the HFCVD process. Alternatively, the method comprises the ALD process, wherein the ALD process comprises the PEALD process, alternatively the spatial ALD process.

Aspect 39. The method of any one of aspects 34-38 wherein the CVD or ALD process is performed at a deposition temperature of from 50 degrees Celsius (° C.) to 800° C. Alternatively, the method is of aspect 34, alternatively aspect 35, alternatively aspect 36, alternatively aspect 37, alternatively aspect 38.

Aspect 40. The method of any one of aspects 34-39 wherein the substrate is composed of a semiconductor material. Alternatively, the semiconductor material is a silicon-based semiconductor material. Alternatively, the semiconductor material is an elemental silicon.

Aspect 41. A film prepared by the method of depositing of any one of aspects 34 to 40. Alternatively, the film is prepared by the method of aspect 34, alternatively aspect 35, alternatively aspect 36, alternatively aspect 37, alternatively aspect 38, alternatively aspect 39, alternatively aspect 40.

Aspect 42. Use of the thiodisilane of formula (I) or the thiosilane of formula (A) in a method of synthesizing silicon disulfide or a method of depositing a silicon-containing film on a substrate. The thiodisilane may be of any one of aspects 1 to 15. Alternatively, the thiodisilane may be any one of the thiodisilanes named in aspect 35. The thiosilane may be of any one of aspects 21 to 28. Alternatively, the thiosilane may be any one of the thiosilanes named in aspect 36.

Aspect 43. The method of aspects 21-28, 34, 36, or 37, wherein the thiosilane comprises a mixture of bis(1,1-dimethylethylthio)silane and 1,1-dimethylethylthiosilane; or a mixture of bis(1,2-dimethylpropylthio)silane and 1,2-dimethylpropylthiosilane.

Aspect 44. The method of aspects 1-15, wherein the thiosilane comprises a mixture of the thiodisilane of any one of aspects 1 to 15 and any one of the thiodisilanes named in aspect 35 or any one of the thiosilanes named in aspect 36. The thiodisilane of the method may comprise a mixture of the thiodisilane of any one of aspects 1 to 15 and any one of the thiodisilanes named in aspect 35, alternatively a mixture of the thiodisilane of any one of aspects 1 to 15 and any one of the thiosilanes named in aspect 36.

Aspect 45. The method wherein the thiosilane comprises a mixture of a thiosilane of any one of aspects 21 to 28 and any one of the thiodisilanes named in aspect 35 or any one of the thiosilanes named in aspect 36. The thiosilane of the method may comprise a mixture of the thiosilane of any one of aspects 21 to 28 and any one of the thiodisilanes named in aspect 35, alternatively a mixture of the thiosilane of any one of aspects 21 to 28 and any one of the thiosilanes named in aspect 36.

Aspect 46. Lithium (1,2-dimethylpropyl)thiolate or lithium 1,1-dimethylethylthiolate.

Aspect 47. In some embodiments is the aminodisilane of formula (II): $(R^2_2N)_{(n+s)}(Si—Si)H_h$ (II), wherein $R^2$ and subscripts n, s and h are as defined above therefor. In other embodiments is the organothiol of formula (III): $R^{1a}R^{1b}R^{1c}CSH$ (III), wherein $R^{1a}$, $R^{1b}$, and $R^{1c}$ are as defined above therefor. In still other embodiments is the thiodisilane of formula (IV): $(R^{1a}R^{1b}R^{1c}CS)_s(R^2_2N)_n(Si—Si)H_h$ (IV), wherein $R^{1a}$, $R^{1b}$, $R^{1c}$, $R^2$ and subscripts n, s and h are as defined above therefor. In some embodiments is the thiodisilane of formula (IV-a): $(R^{1a}R^{1b}R^{1c}CS)_s(Si—Si)H_h$ (IV-a), wherein $R^{1a}$, $R^{1b}$, $R^{1c}$, $R^2$ and subscripts s and h are as defined above therefor.

Aspect 48. In some embodiments is the aminosilane of formula (B): $(R^2_2N)_s(Si)H_h$ (B), wherein $R^2$ and subscripts s and h are as defined above therefor. In other embodiments is the organothiol of formula (C): $R^{1a}R^{1b}R^{1c}CSH$ (C), wherein $R^{1a}$, $R^{1b}$, and $R^{1c}$ are as defined above therefor. In still other embodiments is the thiosilane of formula (D): $(R^{1a}R^{1b}R^{1c}CS)_s(Si)H_h$ (D), wherein $R^{1a}$, $R^{1b}$, $R^{1c}$, $R^2$ and subscripts s and h are as defined above therefor.

Additional invention embodiments, uses and advantages are described below.

The invention has technical and non-technical advantages. The inventive method employs thiosilanes of formula (A), such as bis(1,1-dimethylethylthio)silane and bis(1,2-dimethylpropylthio)silane, that are molecularly stable at room temperature in neat form (purity≥95% to 100%). But bis(alkylthio)silanes have less bulky alkyl groups such as isopropyl or isobutyl, and turn out to be molecularly unstable at room temperature in neat form and instead spontaneously redistribute (i.e., a bis(alkylthio)silane forms a mono(alkylthio)silane and tris(alkylthio)silane). 1,1-dimethylethylthiosilane and 1,2-dimethylpropylthiosilane are also molecularly unstable at room temperature in neat form and instead spontaneously redistribute to form degradation mixtures. The degradation mixtures are of unknown composition and cannot be used as silicon-yielding precursors in (purity or compositionally) sensitive applications such as making Si-containing films for electronic devices, but may have other uses. The 1,1-dimethylethylthiosilane and 1,2-dimethylpropylthiosilane are formed as degradation intermediates generated from degradation of the respective inventive bis(1,2-dimethylpropylthio)silane or bis(1,2-dimethylpropylthio)silane. Formally, two molecules of bis(1,1-dimethylethylthio)silane or two molecules of bis(1,2-dimethylpropylthio)silane undergo a bimolecular reaction (redistribution reaction). The redistribution reactions give a degradation mixture of 1,1-dimethylethylthiosilane and tris (1,1-dimethylethylthio)silane or a degradation mixture of 1,2-dimethylpropylthiosilane and tris(1,2-dimethylpropylthio)silane, respectively. In turn, the 1,1-dimethylethylthiosilane undergoes another bimolecular degradation reaction (redistribution reaction) with another molecule of bis(1,1-dimethylethylthio)silane to give $SiH_4$ and more of the corresponding tris(1,1-dimethylethylthio)silane. Similarly, the 1,2-dimethylpropylthiosilane undergoes another bimolecular degradation reaction (redistribution reaction) with another molecule of bis(1,2-dimethylpropylthio)silane to give $SiH_4$ and more of the corresponding tris(1,2-dimethylpropylthio)silane. In one embodiment, the invention as the proviso that the thiosilane does not include bis(alkylthio) silanes have less bulky alkyl groups such as isopropyl or isobutyl and 1,1-dimethylethylthiosilane and 1,2-dimethylpropylthiosilane, alternatively 1,1-dimethylethylthiosilane and 1,2-dimethylpropylthiosilane.

The inventive thiodisilanes of formula (I), such as (1,2-dimethylpropylthio)disilane, (phenylthio)disilane, and (2-methylphenylthio)disilane, are molecularly stable at room temperature in neat form (purity≥95% to 100%) for similar reasons. The purity of any one of the thio(di)silanes may be determined according to the method described later.

The invention may have additional advantages and uses, some of which may be described later.

This invention is described herein in an illustrative manner by disclosing a plurality of representative, non-limiting inventive embodiments, aspects, and examples thereof. The description may be by way of explicit statements, unambiguous contextual indications, or incorporations by reference to a US patent, US patent application, or US patent application publication to the extent that incorporated subject matter does not conflict with the present description, which would control in any such conflict. Taken together they enable a person of ordinary skill in the art to understand how to make and use the invention without undue experimentation. The description uses certain terms, phrases and expressions that may be readily understood by a skilled artisan and for convenience are defined below in the immediately following five paragraphs. These definitions control unless a different meaning of a term, phrase or expression is stated or clearly indicated from the context of the description elsewhere herein.

The terms aspect and embodiment are used interchangeably. Any inventive example referenced herein may be relied upon and provides adequate support for specific inventive embodiments. Any reference to "invention" or an equivalent expression (e.g., the present invention, this invention or the invention) shall mean those representative inventive embodiments or aspects, and shall not be used to unduly limit inventive scope. Any reference to a Markush group may be equivalently expressed in different ways. E.g., a Markush group of members A, B, and C may be equivalently expressed as: "a member selected from A, B, and C"; "a member selected from the group consisting of A, B, and C"; or "a member A, B, or C". The Markush group may comprise two or more of a genus, a subgenus thereof, and one or more specific members thereof; each of which may be relied upon individually or collectively and provides adequate support for specific inventive embodiments.

Any use of alternatively shall indicate an independent embodiment. The articles "a", "an", and "the" each refer to one or more. Any reference to "comparative," as in comparative example, is for illustration purposes only and shall not mean something from the prior art. Any reference to "contacting" means bringing into physical contact. Any reference to "greater than", as in greater than a specified individual number (e.g., >50 or ≥50), encompasses a range or subrange that includes as its upper endpoint the absolute maximum (e.g., 100%) or, as the case may be where there is no absolute maximum, a practical maximum (e.g., 10,000 repeat units or 10,000,000 g/mol. Alternatively, the upper endpoint may be less than the absolute maximum (e.g., <100%) or less than the practical maximum (e.g., <10,000 repeat units or <10,000,000 g/mol). Any reference to "lack" means free of or a complete absence of. Any reference to "less than", as in less than a specified individual number (e.g., <10 or ≤10), encompasses a range or subrange that includes as its lower endpoint the absolute minimum (e.g., zero (0)) or, as the case may be where there is no absolute minimum, a practical minimum (e.g., greater than zero (>0). E.g., a practical minimum >0 is clear from the context of the expression "present at a concentration less than 10 wt %". Alternatively, the lower endpoint may be greater than the absolute minimum (e.g., >0%). Any use of "may" confers a choice, not an imperative. Any use of "operative" means functionally effective. E.g., "operative contact" comprises functionally effective touching, e.g., as for modifying, coating, adhering, sealing, or filling. The operative contact may be direct physical touching, alternatively indirect touching, provided it is effective for its intended purpose. Any use of "optionally" means is absent (or excluded), alternatively is present (or included). Any ranges relied upon herein describe and contemplate all ranges and subranges including endpoints and whole and/or fractional values therein. A disclosed endpoint or individual number between endpoints of a disclosed range or subrange may be relied upon and provides adequate support for specific inventive embodiments. Any reference to thereof shall refer to, and may be amended to be replaced by, that immediately preceding element, member, feature, limitation, list, or group to which reference is being made.

Any reference to an amount, concentration, or ratio of amounts is based on weight. Any reference to a "by-product" means a secondary product of a chemical transformation of one or more reactants. Any reference to "concentration" as a "percent" or "%" means weight percent (wt %) and is based on total weight of all ingredients used to make the material being described, which total weight is 100 wt %. Any reference to "decomposition" means chemical decomposition, which is the breakdown of a single molecular entity (a collection of molecules having a same structure) into two or more fragments. The fragments may combine to form one or more breakdown product molecules that are different in structure than the structure of the single molecular entity. In types of chemical decompositions where the breakdown product molecules are suitable for the application, use or purpose for with the single molecular entity is intended, the decomposition may be referred to as a non-degradative decomposition. Any reference to "degradation" means a type of chemical decomposition wherein the one or more breakdown product molecules are unsuitable for the application, use or purpose for which the single molecular entity is intended. Any reference to "disproportionation" means a reaction where a single molecular entity forms two or more different molecular entities having different structures and formal oxidation states relative to those of the single molecular entity. Any reference to a "film" or "coating" means a material that is restricted in one dimension. The restricted dimension may be characterized as "thickness". Any reference to a material property (e.g., viscosity) or a test method for measuring same shall be that property measured at or that method conducted at 23 degrees Celsius (° C.) and 101.3 kilopascals (kPa). Any reference to "molecular instability" means chemical instability or a state of being thermodynamically unstable (in neat form) at ambient temperature (e.g., 20° to 30° C.). E.g., a chemical structure that spontaneously undergoes redistribution or disproportionation. In contrast, molecular stability means chemical stability or a state of being thermodynamically stable (in neat form) at ambient temperature, e.g., after 1 day, 1 week, 1 month or longer, such as evidenced by a lack of appreciable change in $^1$H-NMR or $^{29}$Si-NMR or GC. Any reference to a "molecular mass" of a molecule means molecular weight (MW) expressed in grams per mole and any reference to an average molecular mass of a polymer means weight average molecular weight ($M_w$) expressed in grams. $M_w$ is determined using gel permeation chromatography (GPC) with polystyrene standards. Any reference to "purify" means to increase concentration of a desired ingredient (up to ≤100%); alternatively to decrease concentration of one or more undesired ingredients (down to ≥0%), whether or not concentration of the desired ingredient has been increased; alternatively both. Any reference to "redistribution" means a reaction where a single molecular entity forms two or more different molecular entities having different structures but the same formal oxidation state relative to those of the single molecular entity. Any reference to a "remainder" means a portion that is left behind, e.g., a pot residue after a distillation. Any reference to "separation" means to cause to physically move apart, and thus as a result be no longer in direct touching. Any reference to "substrate" means a physical support having at least one surface upon which another material may be hosted. Any reference to "vehicle" means a material acting as a carrier, hosting medium, dispersion medium, supernatant, or solvent for another material, which may or may not be soluble therein. The vehicle may be a liquid.

Any reference to a chemical element, a Group or Groups of chemical elements, or a Periodic Table of the Elements shall mean the chemical elements, Group(s), and Periodic Table of the Elements published by IUPAC, version dated 1 May 2013; see iupac.org/reports/periodic_table/). IUPAC is the International Union of Pure and Applied Chemistry (IUPAC Secretariat, Research Triangle Park, N.C., USA). The intended meaning of any chemical term is that definition promulgated by IUPAC. Any reference to a "catalyst" means a homogeneous or heterogeneous catalyst, which may be supported or unsupported, and which may or may not be a composite catalyst. A homogeneous catalyst forms a solution with reactants and any vehicle. A heterogeneous catalyst is not soluble in the reactants and/or any vehicle present in the reaction. Any reference to "composition" means chemical matter that may be defined by an empirical formula of its constituent elements. Any organic group name ending in suffix "ene", such as hydrocarbylene, alkylene, alkenylene, alkynylene, arylene, phenylene, and the like, means a divalent radical group, which may be straight chain, branched chain, or cyclic. E.g., unsubstituted ($C_3$)hydrocarbylene includes cyclopropylene, methylethylene, and propylene, wherein cyclopropylene means cyclopropane-1,2-diyl; methylethylene means 1-methyl-ethane-1,2-diyl (i.e., propane-2,3-diyl) or 2-methyl-ethane-1,2-diyl (i.e., propane-1,2-diyl); and propylene means propane-1,3-diyl. Any organic group containing a C—H functionality independently may be unsubstituted or substituted with one or more substituents. Each substituent independently may be SUB, wherein each SUB independently is a halogen atom, —NH$_2$, —NHR, —NR$_2$, —NO$_2$, —OH, —OR, oxo (=O), —C≡N, —C(=O)—R, —OC(=O)R, —C(=O)OH, —C(=O)OR, —SH, —SR, —SSH, —SSR, —SC(=O)R, —SO$_2$R, —OSO$_2$R, —SiR$_3$, and —Si(OR)$_3$; wherein each R independently is an unsubstituted ($C_1$-$C_{30}$)hydrocarbyl. Halogen atom is F, Cl, Br, or I; alternatively F, Cl, or Br; alternatively F or Cl; alternatively F; alternatively Cl. A "thiol" is a compound having a C—SH group. An organic group may be monovalent (having one free valence), divalent (having two free valences), trivalent (having three free valences), or tetravalent (having four free valences), also known as univalent, bivalent, trivalent, and quadravalent. Examples of monovalent organic groups are organyl or organoheteryl groups. Examples of organyl groups are hydrocarbyl and heterohydrocarbyl groups. Examples of organoheteryl groups are hydrocarbylamino and hydrocarbyloxy groups. Examples of divalent organic groups are organylene and organoheterylene groups. Examples of organylene groups are hydrocarbylene and heterohydrocarbylene groups. Examples of organoheterylene groups are hydrocarbyleneamino and hydrocarbyleneoxy groups. Heterohydrocarbyl, heterohydrocarbylene, organoheteryl and organoheterylene groups contain one or more heteroatoms selected from O, N, S, and P; alternatively O, N, or S; alternatively O or N; alternatively N; alternatively O.

Any reference to "deposition" in a vapor or atomic layer method means generating, on a specific place, condensed matter. The condensed matter may or may not be restricted in dimension. Examples of deposition are film-forming, rod-forming, and particle-forming depositions. Any reference to a "rod" means a material restricted in two dimensions, e.g., having an aspect ratio>2. Any reference to "silicon-yielding precursor" means a substance or molecule containing atoms of element 14 and being useful as a source of silicon in a deposition method. Examples of such deposition methods are described later. Any reference to "thio (di)silane" means the thiosilane of formula (A), the thiodisilane of formula (I), and any subgenuses thereof (e.g., formulas (I-a), (IV), (IV-a), and (D)). The "thio(di)silane" is a generic term for "thiosilane or thiodisilane." The terms "thiosilane" and "thiomonosilane" are used interchangeably herein and mean a molecule or collection of molecules containing atoms that include, among others, from 1 to 4, alternatively from 2 to 4 sulfur atoms and only 1 silicon atom, wherein each sulfur atom is directly covalently bonded to the silicon atom. The term "thiodisilane" means a molecule or collection of molecules containing atoms that include, among others, from 1 to 6 sulfur atoms and only 2 silicon atoms, wherein each sulfur atom independently is directly covalently bonded to the same or different one of the silicon atoms, with the proviso that no more than 4 sulfur atoms are bonded to any one of the silicon atoms.

The thio(di)silanes of the inventive method may differ from each other in at least one property, function, and/or use. Each of the different thio(di)silanes has unique properties such as a unique vapor pressure, a unique chemical reactivity, a unique deposition rate, a unique molecular symmetry, molecular dipole moment and chemical bonding characteristics, or a combination of any two or more thereof. These unique properties affect physisorption and chemisorption of the substructure on a substrate surface in deposition processes such as CVD or ALD processes. The inventive thio(di)silanes may be further defined as being any one of the species thereof described later in the working examples.

The inventive thio(di)silanes may be further defined by their isotopic compositions. The thio(di)silanes may be a natural abundance isotope form, alternatively an isotopically-enriched form, alternatively a mixture of said forms. The isotopically-enriched forms of the thio(di)silanes include forms that contain a greater-than-natural-abundance amount of deuterium, tritium, $^{29}$Si, $^{30}$Si, $^{32}$Si, or a combination of any two or more thereof. In addition to the uses of the thio(di)silanes described herein, isotopically-enriched forms of the thio(di)silanes may be useful in applications wherein detection of the isotopically-enriched thio(di)silanes or an isotopically-enriched silicon material (e.g., film) made therefrom would be helpful. Examples of such applications are medical research and anti-counterfeiting applications. The thio(di)silanes having different isotopic compositions may differ from each other in at least one property, function, and/or use.

The inventive thio(di)silanes may be stored and transported in neat form (purity≥95% to 100%) under an anhydrous condition (i.e., lacking water), under an inert atmosphere, or, typically, both, i.e., anhydrous inert atmosphere. The inert atmosphere may be a gas of molecular nitrogen, helium, argon, or a mixture of any two or more thereof. Transportation of the thio(di)silane may be from a first reactor in which the thio(di)silane is synthesized to a second reactor in which the thio(di)silane is used as sulfur-containing silicon-yielding precursors. The first reactor may be a continuous stirred-tank reactor, a plug flow reactor, a semi-batch reactor, or a catalytic reactor. The second reactor may be a CVD or ALD reactor.

Another aspect of the inventive method is that it includes a composition comprising the thio(di)silane and at least one additional ingredient that is different than the thio(di)silane. Each additional ingredient independently may independently differ from the thio(di)silane in function, composition, or structure. In some aspects the composition comprises a thiosilane of formula (A) and a thiodisilane of formula (I). In some aspects, the at least one additional ingredient may be a silane that is different than the thio(di)silane.

The at least one, alternatively each additional ingredient of the method of the invention independently may comprise a silicon-yielding precursor other than the thio(di)silane. Examples are a hydridosilane such as monosilane, disilane, trisilane, tetrasilane, pentasilane, hexasilane, heptasilane, octasilane, or nonasilane; or an organosilicon such as an organosilane such as trimethyl- or tetramethyl-monosilane, dichlorodimethyl-monosilane, or chlorotrimethyl-monosilane, or a silaalkane such as 1,3-disilabutane); alternatively an aminosilane or aminodisilane such as diisopropylaminosilane or diisopropylaminodisilane, respectively; alternatively an organic precursor lacking silicon (e.g., an alkane such as methane, including natural gas; carbon tetrachloride; propane; hexane; or a mixture of any two or more thereof), alternatively an inorganic precursor lacking silicon (e.g., anhydrous ammonia, molecular nitrogen, hydrazine, molecular oxygen, ozone, nitrous oxide, water, or hydrogen peroxide), alternatively a mixture thereof. Additionally or alternatively, the additional precursor may be a source of carbon comprising a carbon-containing precursor (e.g., the organosilicon), a source of oxygen comprising an oxygen-containing precursor (e.g., molecular oxygen, ozone, nitrous oxide, water, or hydrogen peroxide), or a source of nitrogen comprising nitrogen-containing precursor (e.g., anhydrous ammonia, molecular nitrogen, or hydrazine), or a combination of any two or more of the source of carbon comprising a carbon-containing precursor, the source of oxygen comprising an oxygen-containing precursor, and the source of nitrogen comprising nitrogen-containing precursor. The additional precursor may function as a solvent for the compound of formula (I), or vice versa, in the composition. The composition that comprises the thio(di)silane and an additional ingredient that contains C or N or O or S may help to deliver the thio(di)silane to a film-forming reactor or help convert the thio(di)silane to a desirable silicon film.

Alternatively or additionally, in the composition the at least one additional ingredient may be a vehicle or carrier gas for a precursor such as a solvent or carrier gas for the thio(di)silane. The carrier gas may be a noble gas such as a gas of He or Ar. The vehicle may be an organic solvent lacking Si. The organic solvent may also function as a source of carbon-containing precursor; alternatively the source of carbon-containing precursor may also function as an organic solvent in the composition.

The thio(di)silane may be synthesized in and the resulting reaction mixture may comprise a hydrocarbon vehicle. The hydrocarbon vehicle may consist of carbon and hydrogen atoms or a may be halogenated hydrocarbon vehicle consisting of carbon, hydrogen, and halogen atoms. The hydrocarbon vehicle consisting of C and H atoms may be alkanes, aromatic hydrocarbons, and mixtures of any two or more thereof. The alkanes may be hexanes, cyclohexane, heptanes, isoparaffins, or mixtures of any two or more thereof. The aromatic hydrocarbon may be toluene, xylenes, or mixtures of any two or more thereof. The halogenated hydrocarbon vehicle may be dichloromethane. The hydrocarbon vehicle may remain in the reaction mixture after the synthesis is performed; alternatively the hydrocarbon vehicle may be removed from the reaction mixture after the synthesis is performed.

The synthesis of the thio(di)silane may comprise one or more contacting steps. The contacting steps independently may further comprise agitating the reactants. The agitating may enhance mixing and contacting together of the reactants and additional ingredients in the reaction mixture. The contacting steps independently may use other conditions, with or without the agitating. The other conditions may be tailored to enhance the contacting, and thus improve the reaction, of the reactants so as to form the intended reaction product in a particular contacting step. The other conditions may be result effective conditions for enhancing reaction yield or minimizing amount of a particular reaction by-product. Examples of the other conditions are reaction atmosphere (gaseous environment in which the reaction is conducted), reaction temperature, and reaction pressure. For example, the contacting steps independently may be performed under an inert gas atmosphere such as a bleed of anhydrous argon or helium gas. Alternatively or additionally, the contacting steps independently may comprise a temperature of the reactants of from a minimum temperature at which said reaction can be appreciated, up to the lower of the boiling point of the lowest boiling ingredient at a pressure employed. Reaction may be appreciated by detecting disappearance of reactants or appearance of product, e.g., by $^{29}$Si and/or $^1$H nuclear magnetic resonance (NMR) spectroscopy. For example, the contacting steps independently may comprise a temperature of the reactants of from −20° to 200° C., alternatively from 0° to 150° C., alternatively from 20° to 120° C., alternatively from 30° to 100° C. The contacting steps independently may be performed under less than ambient pressure, e.g., less than 101.3 kilopascals, and therefore the aforementioned specified temperatures may be lowered in relation to the lowering of the pressure. The conditions used in the different ones of the contacting steps may be the same as or different than the conditions used in any other contacting step(s) and/or the separating steps described herein.

In some aspects the reaction mixture containing the synthesized thio(di)silane is used directly as obtained from the contacting step without purification. For example, the reaction mixture may be stored until future use (e.g., in cold storage having temperatures≤−50° C.) or may be characterized directly for presence and amount of the thio(di)silane contained therein. In other aspects the method of synthesizing the thio(di)silane may be further defined by one or more optional subsequent steps that come after the contacting step. The method may further comprise a subsequent step of separating the thio(di)silane from other thio(di)silane isomers, from the reaction by-product(s), from any unreacted reactants, from any additional reaction ingredient (e.g., vehicle), or from a combination of any two or more thereof, to give a purified thio(di)silane.

The separating step, when employed, may comprise any technique suitable for separating the thio(di)silane from the reaction by-product and any unreacted reactants or additional ingredients (e.g., vehicle). Different techniques may be preferred for different thio(di)silanes. One technique may be employed or a sequence of two or more techniques may be employed. A given technique may be performed one time or repeated two or more times, each time with a product of a prior technique in order to iteratively decrease impurity content to yield an iteratively purified thio(di)silane, e.g., a purified thio(di)silane having iteratively lower atomic concentrations of nitrogen. Examples of suitable techniques are decanting, distilling, evaporating, extracting, filtering, freeze drying, gas chromatography, ion exchange chromatography, partitioning, phase separating, reverse phase liquid chromatography, stripping, volatilizing, and washing. In some aspects the technique comprises fractional distillation or filtration followed by fractional distillation. Alternatively or additionally, the thio(di)silane may be subjected to reverse phase liquid chromatography. Examples of suitable reverse phase liquid chromatography techniques are reverse phase medium pressure column chromatography (RP-MPLC) and reverse phase high pressure column chromatography (RP-HPLC), wherein the stationary phase is a solid such as silica gel and the mobile phase is an anhydrous, aprotic organic solvent such as anhydrous hexanes, anhydrous acetonitrile, anhydrous ethyl acetate, or a mixture of any two or more thereof.

For example, in some aspects the contacting step may produce a reaction mixture having therein a solid carried over into the contacting step (from an optional preliminary step), and/or having therein a solid precipitate formed in situ as a reaction by-product during the contacting step. In these aspects the separating step may comprise filtering such a reaction mixture to remove the solids to give a filtrate containing the thio(di)silane and lacking solid reaction by-products. The filtrate may be distilled or stripped to remove volatile components therefrom to give a remainder containing a concentrated form of the thio(di)silane. The volatile components removed in this way are components having a lower boiling point than the boiling point of the thio(di)silane and may include, e.g., any unreacted starting materials and/or any reaction by-products.

Any reaction by-products and other ingredients of a reaction mixture having a lower boiling point than the boiling point of the thio(di)silane may be removed before removal of the thio(di)silane via an evaporative method to give a remainder comprising a concentrated form of the thio(di)silane. The thio(di)silane may be distilled or stripped from the remainder to give the purified thio(di)silane and leave behind a pot residue comprising a remainder containing any non-volatile reaction by-products and/or any non-volatile additional ingredients. The non-volatile components left behind in this way are components having a higher boiling point than the boiling point of the thio(di)silane and may include, e.g., non-volatile vehicle such as the vehicle and/or oligomeric or polymeric by-products formed by condensation of two or more silane molecules during the contacting step.

The concentrated form of the thio(di)silane may then be purified by fractional distillation to give a purified form of the thio(di)silane. The purity of the thio(di)silane and the purified thio(di)silane may be determined by reverse phase liquid chromatography or, more likely, by gas chromatography (GC) as described later. For example, the purity determined by GC may be from 60 area % to ≤100 area % (GC), alternatively from 70 area % to ≤100 area % (GC), alternatively from 80 area % to ≤100 area % (GC), alternatively from 90 area % to ≤100 area % (GC), alternatively from 93 area % to ≤100 area % (GC), alternatively from 95 area % to ≤100 area % (GC), alternatively from 97 area % to ≤100 area % (GC), alternatively from 99.0 area % to ≤100 area % (GC). Each ≤100 area % (GC) independently may be equal to 100 area % (GC), in which aspect the purified thio(di)silane is the thio(di)silane per se. Alternatively each ≤100 area % (GC) independently may be <100 area % (GC), in which aspect the purified thio(di)silane is the composition. The maximum purity of the composition having <100 area % (GC) may be 99.9999999 area % (GC) ("nine 9's" purity), alternatively 99.999999 area % (GC) ("eight 9's" purity), alternatively 99.99999 area % (GC) ("seven 9's" purity), alternatively 99.9999 area % (GC) ("six 9's" purity), alternatively 99.999 area % (GC) ("five 9's" purity), alternatively 99.99 area % (GC) ("four 9's" purity), alternatively 99.9 area % (GC), all of the thio(di)silane. It is believed that the thio(di)silane, or the composition that consists essentially of the foregoing six 9's to nine 9's purity of the thio(di)silane, may be particularly useful in making silicon materials for electronics and/or photovoltaic applications, wherein generally the higher the number of 9's purity the better the usefulness thereof in said applications.

A method of forming silicon alloy, the method comprising reacting silicon disulfide with an oxygen, alternatively ozone, or a nitrogen precursor.

In one embodiment, the silicon alloy is a silicone oxide according to the formula $SiO_x$, where x is an integer, alternatively an integer from 1 to 4, alternatively 1 or 2.

In one embodiment the silicon allow is a silicon nitride according to the formula $SiN_x$, where x is an integer, alternatively an integer from 1 to 4.

The nitrogen precursor is a compound that will react to form the silicon nitride, alternatively ammonia, an ammonia plasma, or a nitrogen plasma.

The silicon disulfide is as described above. The silicone dioxide may be made by the process described above, wherein a thio(di)silane is heated to decompose the thio(di)silane to produce the $SiS_x$.

The oxygen precursor, alternatively ozone, or nitrogen precursor may be combined with the thio(di)silane as the thio(di)silane or in intermittent pulses alternating between the thio(di)silane and the oxygen precursor or nitrogen precursor followed by thio(di)silane decomposition to form $SiS_x$ such that the oxygen precursor or nitrogen precursor reacts with the $SiS_x$ as it is produced.

The reactor used to react the $SiS_x$ may be any reactor suitable for decomposition of the thio(di)silane and/or gas phase reactions. One skilled in the art would know how to select a suitable reactor.

The temperature at which the $SiS_2$ is reacted with the oxygen precursor or nitrogen precursor is a temperature sufficient to cause the reaction, alternatively 250 to 650° C. to elevated temperature, alternatively from 300 to 600° C., alternatively from 400 to 525° C.

One skilled in the art would know how to generate ozone to react with the $SiS_2$.

The ozone and the $SiS_2$ are reacted at reduced pressure, alternatively at a pressure from 0.01 to 10 Torr, alternatively from 0.05 to 0.5 Torr.

The thiosilanes for use in the methods of the invention may further include t-butylthiosilane; bis(t-butylthio)silane; t-pentylthiosilane; bis(t-pentylthio)silane; (2-methylphenylthio)silane; bis(2-methylphenylthio)silane; (2,6-dimethylphenythio)silane; bis(2,6-dimethylphenylthio)silane; bis(phenylthio)silane; phenylthiosilane.

The thiodisilanes for use in the methods of the invention may further include bis(phenylthio)disilane; (t-pentylthio)disilane; bis(t-pentylthio)disilane; (benzylthio)disilane; bis(benzylthio)disilane; (2-methylphenylthio)disilane; bis(2-methylphenylthio)disilane; (2,6-dimethylphenylthio)disilane; or bis(2,6-dimethylphenylthio)disilane.

The invention is further illustrated by, and an invention embodiment may include any combinations of features and limitations of, the non-limiting examples thereof that follow. Ambient temperature is about 23° C. unless indicated otherwise.

Differential Scanning Calorimetry (DSC) Method 1: instrument and standard conditions: a known weight of a sample material was loaded into a 20 microliter (μL) high pressure DSC crucible, and the crucible was sealed using a press and loaded into a furnace of a Mettler Toledo TGA/DSC 1 instrument. The furnace was thermally equilibrated at 35° C. for 20 minutes, then ramped from 35° to 400° C. at a heating rate of 10° C. per minute, held at 400° C. for 20 minutes, cooled to ambient temperature (23° C.±1 C) at a cooling rate of 10° C. per minute, and then reheated to 400° C. at a heating rate of 10° C./minute. The crucible was removed from the furnace, allowed to cool, and the weight of the sample material remeasured to determine if the sample lost mass during the test method.

Differential Scanning Calorimetry (DSC) Method 2: instrument and isothermal conditions: a known weight of a sample material was loaded into a 100 μL Netzsch chrome nickel steel with gold sealing disc high pressure crucible. The loaded crucible was sealed with a torque wrench and loaded into a furnace of a Mettler Toledo TGA/DSC 1 instrument. The furnace was ramped from 35° C. to the specified temperature (e.g., 350° C.) at a heating rate of 10° C. per minute, held at the specified temperature for 60 minutes, cooled to 35° C. at a cooling rate of 10° C. per minute, and then reheated to the specified temperature at 10° C. per minute. The specified temperature may be identified as a temperature shown by DSC Method 1 to give a signal of interest in its thermal profile of a material, an investigation of which signal may be carried out using DSC Method 2 to understand what happens chemically at that signal's temperature. (E.g., if a material shows transitions at 250° C. and 350° C. in DSC Method 1, two isothermal samples of the same material may be prepared and run in DSC Method 2 to 250° C. and to 350° C., respectively.) Then the crucible was removed from the furnace and the residue was measured for weight loss. A feature of DSC Method 2 is that the crucible can be opened and the residue analyzed. The residue comprised a solid and a liquid. The liquid content of the crucible was extracted with pentane and chemically characterized by GC-FID and GC-MS. The solid remaining after extraction was dried under vacuum and characterized using Raman spectroscopy.

Raman Spectroscopy Method 1: instrument and conditions. Instrument: Raman microscope spectrometer (Kaiser Optical Systems Inc.) equipped with a 785 nm diode laser without objective lens. An opened crucible containing the remaining solid residue from DSC Method 2 (isothermal) was sealed in an argon-filled air-tight glass vial and Raman spectra were collected using the Raman microscope spectrometer with 50 milliWatt (mW) laser power and a total 300 seconds scans at 5 $cm^{-1}$ resolution.

Gas Chromatography-Flame Ionization Detector (GC-FID) instrument and conditions: a capillary column with 30 meters length, 0.32 mm inner diameter, and containing a 0.25 μm thick stationary phase in the form of a coating on the inner surface of the capillary column, wherein the stationary phase was composed of phenyl methyl siloxane. Carrier gas was helium gas used at a flow rate of 105 mm per minute. GC instrument was an Agilent model 7890A gas chromatograph. Inlet temperature was 200° C. GC experiment temperature profile consisted of soaking (holding) at 50° C. for 2 minutes, ramping temperature up at a rate of 15° C./minute to 250° C., and then soaking (holding) at 250° C. for 10 minutes.

Gas Chromatography-Thermal Conductivity Detector (GC-TCD) instrument and conditions: a capillary column with 30 meters length, 0.32 mm inner diameter, and containing a 0.25 μm thick stationary phase in the form of a coating on the inner surface of the capillary column, wherein the stationary phase was composed of phenyl methyl siloxane. Carrier gas was helium gas used at a flow rate of 105 mm per minute. GC instrument was an Agilent model 7890A gas chromatograph. Inlet temperature was 200° C. GC experiment temperature profile consisted of soaking (holding) at 50° C. for 2 minutes, ramping temperature up at a rate of 15° C./minute to 250° C., and then soaking (holding) at 250° C. for 10 minutes.

GC-MS instrument and conditions: Sample was analyzed by electron impact ionization and chemical ionization gas chromatography-mass spectrometry (EI GC-MS and CI GC-MS). Agilent 6890 GC conditions included a DB-1 column with 30 meters (m)×0.25 millimeter (mm)×0.50 micrometer (μm) film configuration. An oven program of soaking at 50° C. for 2 minutes, ramping at 15° C./minute to 250° C., and soaking at 250° C. for 10 minutes. Helium carrier gas flowing at constant flow of at 1 mL/minute and a 50:1 split injection. Agilent 5973 MSD conditions included a MS scan range from 15 to 800 Daltons, an EI ionization and CI ionization using a custom CI gas mix of 5% $NH_3$ and 95% $CH_4$.

$^{29}Si$-NMR instrument and solvent: a Varian 400 MHz Mercury spectrometer was used. $C_6D_6$ was used as the solvent.

$^{13}C$-NMR instrument and solvent: a Varian 400 MHz Mercury spectrometer was used. $C_6D_6$ was used as the solvent.

$^{1}H$-NMR instrument and solvent: a Varian 400 MHz Mercury spectrometer was used. $C_6D_6$ was used as the solvent.

Boiling Point Test Method 1: use ACD/Labs Percepta Boiling Point Module, 2012 release, Advanced Chemistry Development, Inc., Toronto, Ontario, Canada.

Experimental technique: all chemical manipulations were performed using an inert atmosphere and Schlenk apparatus and glove box. Suitable solvent for forming a lithium hydrocarbylthiolate such as a lithium alkylthiolate is an anhydrous form of diethyl ether, dibutyl ether, 1,2-dimethoxyethane, or a mixture of any two or three thereof.

Inventive Example (IEx.) (a): synthesis of lithium 1,1-dimethylethylthiolate. To a stirred solution of 1,1-dimethylethylthiol (280 g, 3.1 mol) in anhydrous diethyl ether at −40° C. was added dropwise a 6.3 Molar solution of n-butyl lithium in hexanes, and after the addition was complete the resulting mixture was allowed to warm to room temperature to give a solution of lithium 1,1-dimethylethylthiolate.

IEx. 1: synthesis of bis(1,1-dimethylethylthio)silane, which is of formula

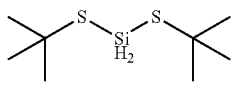

To a stirred solution of dichlorosilane ($SiCl_2H_2$; 156.8 g. 1.55 mol) in heptane at 40° C. was added the solution of lithium 1,1-dimethylethylthiolate of IEx. (a) (3.1 mol) to give a reaction mixture. The rate of addition of the solution of lithium 1,1-dimethylethylthiolate was controlled to keep the temperature of the reaction mixture at −40° C. After the addition was complete, the reaction mixture was stirred for 2 hours at −40° C., and then allowed to warm to room temperature. The resulting mixture was filtered through a glass frit to remove solids (e.g., LiCl), and the filtrate was fractionally distilled to give the bis(1,1-dimethylethylthio) silane (70% yield) as a clear, colorless liquid. $^{1}H$-NMR 1.39 ppm (singlet, 2H), 5.39 ppm (singlet, 2H). $^{13}C$-NMR: 33.92 ppm (singlet), 45.42 ppm (singlet). $^{29}Si$-NMR: −30.99 ppm (triplet). GC/MS: molecular ion (m/z=208.2) were consistent with bis(1,1-dimethylethylthio)silane.

IEx. (b): synthesis of lithium 1,2-dimethylpropylthiolate. To a stirred solution of 1,2-dimethylpropylthiol (10.0 g, 0.096 mol) dissolved in 50 g hexanes at −5° C., was added dropwise 38.4 mL of 2.5 M solution of n-butyl lithium in hexanes, and after the addition was complete, copious amounts of a white precipitate had formed, which was lithium 1,2-dimethylpropylthiolate. The resulting mixture was allowed to warm to room temperature and stirred for 1 hour. Then, the supernatant solution was decanted, and the remaining solid was washed with 10 mL of pentane and dried under reduced pressure to yield 10.08 g (0.092 mol, 95.4% yield) of lithium 1,2-dimethylpropylthiolate.

IEx. 2: synthesis of bis(1,2-dimethylpropylthio)silane, which is of formula

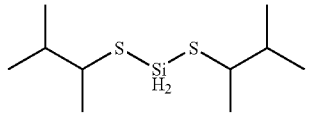

To a stirred solution of dichlorosilane ($SiCl_2H_2$; 3.21 g. 0.032 mol) in heptane at −20° C. was added 7.00 g (0.064 mol) of solid lithium 1,2-dimethylpropylthiolate of IEx. (b) in 1 g portions spread over 25 minutes to give a reaction mixture. After the addition was complete, the reaction mixture was stirred for 10 minutes at −20° C. and then slowly warmed to room temperature. The resulting mixture was filtered through a glass frit to remove solids (LiCl), and the low-boiling components were removed from the filtrate under reduced pressure to give 4.44 g (0.019 mol, 59.0% yield) of bis(1,2-dimethylpropylthio)silane as a clear, colorless liquid. The bis(1,2-dimethylpropylthio)silane can be further purified by distillation if desired. 1H-NMR: 0.88 ppm (doublet, 6H), 0.93 ppm (doublet, 6H), 1.25 ppm (doublet 6H), 1.73 ppm (multiplet, 2H), 3.00 ppm (multiplet, 2H), 5.31 ppm (singlet, 2H). $^{13}C$-NMR: 19.07 ppm, 19.51 ppm, 21.44 ppm, 21.48 ppm, 35.55 ppm, 47.03 ppm, 47.10 ppm. $^{29}Si$-NMR: −15.93 ppm (triplet). GC/MS molecular ion (m/z=236.2) were consistent with bis(1,2-dimethylpropylthio)silane.

IEx. 3: synthesis of dichloro-bis(1,2-dimethylpropylthio)-silane, which is of formula

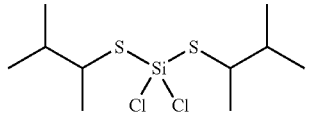

To a stirred solution of silicon tetrachloride (1.54 g, 0.009 mol) in 10 mL of pentane at 0° C. was added 2.00 g (0.018 mol) of solid lithium 1,2-dimethylpropylthiolate of IEx. (b) slowly over 40 minutes to give a reaction mixture. After the addition was complete, the reaction mixture was stirred for 1 h. The resulting mixture was filtered through a glass frit to remove solids (LiCl), and the low-boiling components were removed from the filtrate under reduced pressure to give 2.23 g of crude bis(1,2-dimethylpropylthio)-dichlorosilane (58.4% pure, 0.04 mol, 47.0% yield) as a clear, colorless liquid. The bis(1,2-dimethylpropylthio)silane can be further purified by distillation if desired. GC/MS molecular ion (m/z=304.1) was consistent with dichloro-bis(1,2-dimethylpropylthio)-silane.

IEx. 4: attempted synthesis of a composition comprising a mixture of bis(1,1-dimethylethylthio)silane and 1,1-dimethylethylthiosilane, which is of formula.

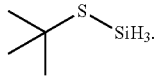

Heat neat bis(1,1-dimethylethylthio)silane in a 15 mL scintillation vial with a septum vented with a needle to 157° C. for 10 minutes so that it thermally redistributed, and cool to room temperature to give the composition comprising bis (1,1-dimethylethyl)disulfide (($CH_3$)$_3$CSSC($CH_3$)$_3$) as a clear, colorless liquid. GC/MS molecular ion (m/z=178.1) was consistent with bis(1,1-dimethylethyl)disulfide (($CH_3$)$_3$CSSC($CH_3$)$_3$).

IEx. 5: synthesis of 1,1-dimethylethylthiodisilane: 1,1-dimethylethylthiol (6.74 g; 74.7 mmol) was added to diisopropylaminodisilane (10.05 g; 62.3 mmol) at room temperature. The resulting mixture was heated at 60° C. for 2 hours, and cooled to room temperature. GC analysis showed a 99% conversion to 1,1-dimethylethylthiodisilane. The reaction mixture was fractionally distilled through a 6-inch (15 centimeter (cm)) Vigreux column to give 1,1-dimethylethylthiodisilane having 98.1% purity by GC-FID. $^1$H NMR, GC-FID, GC-MS and DSC Method 1 (standard conditions) were consistent with 1,1-dimethylethylthiodisilane.

IEx. 6: synthesis of phenylthiodisilane: Thiophenol (5.34 g; 48.5 mmol; $C_6H_5SH$) was added to diisopropylaminodisilane (8.60 g; 53.3 mmol) at up to 40° C. The resulting mixture was heated at 70° C. for 0.5 hour to give phenylthiodisilane. GC-FID analysis showed a 95% conversion to phenylthiodisilane. The reaction mixture was fractionally distilled through a 6-inch (15 cm) Vigreux column to give phenylthiodisilane having 99.2% purity by GC-FID. 1H NMR, GC-FID, GC-MS and DSC Method 1 (standard conditions) were consistent with phenylthiodisilane.

IEx. 7: synthesis of 2-(methylphenylthio)disilane: toluenethiol (4.27 g; 34.4 mmol) was added to diisopropylaminodisilane (6.10 g; 37.8 mmol) at up to 35° C. The resulting mixture was heated at 70° C. for 0.5 hour. GC-FID analysis showed a 96% conversion to 2-(methylphenylthio)disilane. The reaction mixture was fractionally distilled through a 6-inch (15 cm) Vigreux column to give 2-(methylphenylthio)disilane having 99.5% purity by GC-FID. 1H NMR, GC-FID, GC-MS and DSC Method 1 (standard conditions) were consistent with 2-(methylphenylthio)disilane.

IEx. 8: synthesis of t-pentylthiosilane; a solution of diisopropylaminosilane (DiPAS) in toluene containing 7.7% (w/w) DiPAS or 1.00 g (7.65 mmol) of DiPAS was loaded in a Schlenk tube. Then 2.15 g (20.6 mmol) of t-pentylthiol was added dropwise at room temperature. This reaction mixture was heated at 62° C. for 60 minutes, and fractionally distilled through a 12 inch Vigreux column under vacuum to recover a clear liquid product (0.90 g). The liquid product was analyzed by GC-FID and GC-MS and contained 41% (w/w) t-pentylthiosilane.

IEx. 9: Synthesis of phenylthiosilane PhSSiH$_3$ and bisphenylthiosilane (PhS)$_2$SiH$_2$: A solution of diisopropylaminosilane (DiPAS) in toluene containing 7.7% (w/w) DiPAS or 1.03 g (7.84 mmol) of DiPAS was loaded in a Schlenk tube. Then 0.786 g (7.13 mmol) of thiophenol was added dropwise at room temperature. This reaction mixture was heated at 67° C. for 30 minutes, and evacuated at room temperature to remove low boilers. A clear liquid residue (0.50 g) was recovered as the product. The liquid product was analyzed by GC-FID and GC-MS and contained 95% (w/w) phenylthiosilane. Bisphenylthiosilane was formed at 32% conversion from phenylthiosilane in 3 days at room temperature.

IEx. 10: Synthesis of 2-methylphenylthiosilane 2-MePhSSiH$_3$ and bis(2-methylphenylthio)silane (2-MePhS)$_2$SiH$_2$: A solution of diisopropylaminosilane (DiPAS) in toluene containing 7.7% (w/w) DiPAS or 1.00 g (7.61 mmol) of DiPAS was loaded in a Schlenk tube. Then 1.12 g (9.02 mmol) of 2-methylthiophenol was added dropwise at room temperature. This reaction mixture was heated at 65° C. for 30 minutes, and evacuated at room temperature to remove low boilers. A clear liquid residue (1.10 g) was recovered as the product. The liquid product was analyzed by GC-FID and GC-MS and contained 95% (w/w) 2-methylphenylthiosilane. Bis(2-methylphenylthio)silane was formed at 15% conversion from 2-methylphenylthiosilane in 3 days at room temperature.

IEx. 11: Synthesis of 2,6-dimethylphenylthiosilane 2,6-Me$_2$PhSSiH$_3$ and bis(2,6-dimethylphenylthio)silane (2,6-Me$_2$PhS)$_2$SiH$_2$: A solution of diisopropylaminosilane (DiPAS) in toluene containing 7.7% (w/w) DiPAS or 1.06 g (8.07 mmol) of DiPAS was loaded in a Schlenk tube. Then 1.27 g (9.19 mmol) of 2,6-dimethylthiophenol was added dropwise at room temperature. This reaction mixture was heated at 67° C. for 30 minutes, and evacuated at room temperature to remove low boilers. A clear liquid residue (1.37 g) was recovered as the product. The liquid product was analyzed by GC-FID and GC-MS and contained 95% (w/w) 2,6-dimethylphenylthiosilane. Bis(2,6-dimethylphenylthio)silane was formed at 5% conversion from 2,6-dimethylphenylthiosilane in 31 days at room temperature.

IEx. 12: Synthesis of benzylthiodisilane PhCH$_2$SSiH$_2$SiH$_3$: Benzylthiol (0.651 g; 5.24 mmol) was added to diisopropylaminodisilane (0.930 g; 5.76 mmol) at room temperature. The resulting mixture was heated at 66° C. for 0.5 hour. GC-FID analysis showed a 99% conversion to benzylthiodisilane. The reaction mixture was evacuated at room temperature to remove low boilers. A clear liquid residue (0.50 g) was recovered as the product. The product contained 97% benzylthiodisilane by GC-FID. 1H NMR, GC-FID and GC-MS were consistent with benzylthiodisilane.

IEx. 13: SiOx film grown by ALD from Bis(tertbutylthio)silane (BBTS) and Ozone: In this example, BBTS, is employed as the silicon source and Ozone is used as the oxidizing source. The film is grown as follows.

A Silicon wafer was placed into a vacuum chamber and heated to a temperature between 200-600° C. The wafer is exposed to 200 pulses of ozone as a pretreatment in order to clean and prepare the deposition interface for the thiosilane. The pulse duration of the ozone was 0.5 sec. The wafer was then exposed to alternating cycles of thiosilane and ozone with an Argon purge step between each reactant cycle. The pulse duration of the thiosilane ranged between 0.5-8 sec. The purge duration ranged from 1 to 20 sec. The film growth was monitored in real time using an in-situ ellipsometer. By monitoring the film growth throughout the deposition process, and precisely measuring the cycle time, the growth rate per cycle was determined.

Typical deposition conditions are as follows:
Deposition tool: Veeco Cambridge Nanotech Systems Fiji
Ellipsometer: JA Woollam M2000 in situ ellipsometer
Gas flows:
BBTS: injection pulse duration between 0.5-8 sec
Argon: 130 sccm.
Ozone: injection pulse duration between 0.5-2 sec FIG. 1 represents the behavior of the film growth as a function of surface temperature. We observe the growth per cycle (GPC) increases by a factor of 16 between 300-400° C., where it stabilized to a relatively constant value of 1.35 Å/cycle between 400-525° C. Above 550° C. the GPC began to decrease. The ALD window was between 400-525° C. The BBTS dose was 2 seconds and the Ozone was 2.5 seconds (5×0.5 sec). A 2 sec dose was found to be convenient from a precursor utilization perspective and represented 93% of saturation.

FIG. 2 depicts the saturation curve found for the same process. In this example, the substrate temperature was fixed in the center of the ALD window, at 450° C. and change the exposure time of the BBTS. The curve shows a steep increase in GPC from 0.5 to 2 seconds, followed by a relatively constant average value of 1.4 Å/cyl. The insensitivity the GPC to the BBTS injection time when the dose exceeds 2 sec strongly suggests that the surface is saturated by either the monomer molecules residing in a chemisorption well or by a linear polymer of the thermal break down product, SiS2, as predicted by molecular modeling. In either case, further adsorption from precursors is inhibited.

IEx. 14. SiNx Film grown by PEALD from BBTS and an Ammonia Plasma: Example 9 was repeated except for the following differences. Ammonia plasma was used as the nitridation source in place of ozone as the oxygen source in Example 9. The film was grown as in Example 9 except the wafer was exposed to a 300 sec continuous exposure of a 300W ammonia plasma as a pretreatment in order to clean and prepare the deposition interface for the thiosilane. The flow rate of the ammonia was 50 sccm mixed with Ar at 130 sccm. The ammonia plasma was 300 Watts (W) applied power with 50 sccm $NH_3$ and 130 sccm argon, and the exposure to the wafer of the plasma ws between 5-20 seconds. Argon was used at 130 sccm.

FIG. 3 represents the behavior of the film growth as a function of surface temperature. A fifty fold increase in the GPC was observed between 250-375° C., where it stabilized to a relatively constant value of 1.00 Å/cycle between 400-550° C. Above 550° C. the GPC began to decrease. Based on similar behavior found in the literature, we defined the ALD window as between 420-550° C. The BBTS dose was 2 seconds and the NH3 Plasma was 10 seconds. A 2 sec dose was found to be convenient from a precursor utilization perspective and represented 90% of saturation.

FIG. 4 depicts the saturation curve found for the same process. In this experiment, we hold the substrate temperature fixed in the center of the ALD window, at 500° C. and change the exposure time of the BBTS. The curve shows a steep increase in GPC from 0.5 to 2 seconds, followed by a relatively constant average value of 1.30 Å/cyl. The insensitivity the GPC to the BBTS injection time when the dose exceeds 2 sec strongly suggests that the surface was saturated by either the monomer molecules residing in a chemisorption well or by a linear polymer of the thermal break down product, SiS2, as predicted by molecular modeling. In either case, further adsorption from precursors was inhibited IEx. 15: Example of a SiNx Film grown by CVD from Bis(tertbutylthio) silane and Ammonia: Example 10 was repeated with the following exceptions. Ammonia was used as the nitridation source. Ammonia was introduced at 50 sccm mixed with argon at 130 sccm.

FIG. 5 represents the behavior of the film growth as a function of surface temperature. We observe an eight fold increase in the GPC between the threshold at 300° and 500° C. In this case, the growth rate monotonically rises and never achieves a stable plateau which is indicative of a cyclic CVD process. The BBTS dose was 2 seconds and the $NH_3$ was 10 seconds.

IEx. 16: SiOx film grown by ALD from Tris(methanethiol)silane (TMTS) and Ozone: Example 9 was repeated with the following exceptions. The silicon oxide film was grown using TMTS as the thiosilane.

After an initial rapid nucleation period a linear film thickness growth was observed and a steady state GPC was calculated.

FIG. 6 represents the behavior of the film growth as a function of surface temperature. The steady state GPC was observed to increase a factor of 5 between 400-500° C. where it stabilizes to a relatively constant value of 1.00 Å/cycle between 470-625° C. The instrument was not capable of exceeding the maximum temperature of 625° C., thus the behavior of the GPC could not be determined above this value. The ALD window was defined as between 475-625° C. The TMTS dose was 2 seconds and the Ozone was 2.5 seconds (5×0.5 sec). A 2 sec dose was found to be convenient from a precursor utilization perspective and represented 100% of saturation.

FIG. 7 depicts the saturation curve found for the same process. In this example, we held the substrate temperature fixed in the center of the ALD window, at 560° C. and change the exposure time of the TMTS. The curve shows no change in the value of GPC in the range of 0.5-2.0 seconds (sec). The insensitivity the GPC to the TMTS injection time suggests that the surface was saturated by either the monomer molecules residing in a chemisorption well or by a linear polymer of the thermal break down product, SiS2, as predicted by molecular modeling. In either case, further adsorption from precursors was inhibited.

Example 17: SiNx Film grown by PEALD from Tris (methanethiol)silane, TMTS and an Ammonia Plasma: A silicon nitride film was grown with a thiosilane as the silicon source. In this example, Tris(methanethiol)silane, TMTS was employed as the silicon source and an ammonia plasma was used as the nitridation source. The silicon nitride films were grown as in Example 10 with the following exceptions. TMTS was used as the silicon source, and the TMTS injection pulse duration was between 0.5-8 sec.

FIG. 8 represents the behavior of the film growth as a function of surface temperature. We observed a fivefold increase in the GPC between 300-400° C. where it stabilizes to a relatively constant value of 0.8-0.9 Å/cycle between 400-570° C. The instrument was not capable of exceeding the maximum temperature of 625° C., thus the behavior of the GPC could not be determined above this value. The ALD window was defined as between 420-570° C. The TMTS dose was 2 seconds and the $NH_3$ Plasma was 10 seconds. A 2 sec dose was found to be convenient from a precursor utilization perspective and represented saturation.

FIG. 9 depicts the saturation curve found for the same process. In this example, the substrate temperature was held fixed in the center of the ALD window, at 500° C. and change the exposure time of the TMTS. The curve shows a steep increase in GPC from 0.5 to 2 seconds, followed by a relatively constant average value of 0.9-1.1 Å/cyl. The insensitivity the GPC to the TMTS injection time when the dose exceeds 2 sec strongly suggests that the surface was saturated by either the monomer molecules residing in a chemisorption well or by a linear polymer of the thermal break down product, SiS2, as predicted by molecular modeling. In either case, further adsorption from precursors was inhibited.

IEx. 18: Modeling of chemisorption of phenylthiodisilane on a silicon dioxide surface: the energy barriers and enthalpy changes of six break-down reactions of phenylthiodisilane were modeled first. The six break-down reactions involve the cleavage of the Si—Si, Si—S or S—C bond in phenylthiodisilane. The cleavage of the Si—Si bond to form phenylthiosilylene PhS(H)Si: through the reaction $PhSSiH_2SiH_3 \rightarrow PhS(H)Si$: +$SiH_4$ was found to have the lowest energy barrier of 43.78 kcal/mol and the enthalpy change of 34.47 kcal/mol. The energy barrier and enthalpy change of the insertion of phenylthiosilylene PhS(H)Si: to surface SiOH groups on $SiO_2$ substrate, PhS(H)Si: +Surface-SiOH→Surface-SiOSiH$_2$SPh, were modeled next. The energy barrier and enthalpy change of the insertion reaction is 27.5 kcal/mol and −57.0 kcal/mol respectively, suggesting that this insertion reaction can be fast and complete, and should be a chemisorption pathway for phenylthiodisilane on a SiO$_2$ surface. The modeling employed Vienna Ab-initio Simulation Package (VASP) software applying Perdew-Burke-Ernzerhof (PBE) and Density Functional Theory (DFT) exchange-correlation functionals with a plane-wave basis set with a cutoff energy of 400 eV. Transition state structures were obtained using the nudged elastic band method.

IEx. 19: Modeling of chemisorption of phenylthiodisilane on a silicon nitride surface: the energy barriers and enthalpy changes of six break-down reactions of phenylthiodisilane were modeled first. The six break-down reactions involve the cleavage of the Si—Si, Si—S or S—C bond in phenylthiodisilane. The cleavage of the Si—Si bond to form phenylthiosilylene PhS(H)Si: through the reaction PhSSiH$_2$SiH$_3$→PhS(H)Si: +SiH$_4$ was found to have the lowest energy barrier of 43.78 kcal/mol and the enthalpy change of 34.47 kcal/mol. The energy barrier and enthalpy change of the insertion of phenylthiosilylene PhS(H)Si: to surface SiNH$_2$ groups on SiN substrate, PhS(H)Si: +Surface-SiNH$_2$→Surface-SiN(H)SiH$_2$SPh, were modeled next. The energy barrier and enthalpy change of the insertion reaction is 50.9 kcal/mol and −44.0 kcal/mol respectively, suggesting that this insertion reaction can be fast and complete, and should be a chemisorption pathway for phenylthiodisilane on a SiN surface. The modeling employed Vienna Ab-initio Simulation Package (VASP) software applying Perdew-Burke-Ernzerhof (PBE) and Density Functional Theory (DFT) exchange-correlation functionals with a plane-wave basis set with a cutoff energy of 400 eV. Transition state structures were obtained using the nudged elastic band method.

IEx. A: preparation of a silicon nitride film (prophetic) using bis(1,1-dimethylethylthio)silane and ammonia (NH$_3$) with LPCVD: using a LPCVD reactor and a bubbler containing the bis(1,1-dimethylethylthio)silane of IEx. 1 and in fluid communication with the LPCVD reactor. Feed ammonia diluted in helium to the LPCVD reactor. Heat the bubbler containing bis(1,1-dimethylethylthio)silane to 70° C. to increase vapor pressure thereof. Then flow He carrier gas through the bubbler to carry vapor of bis(1,1-dimethylethylthio)silane into the LPCVD reactor, wherein the LPCVD reactor contains vaporous ammonia and a plurality of vertically oriented and spaced apart silicon wafers heated to from 60° to 250° C. so a conformal silicon nitride film is formed on the wafers.

IEx. B: preparation of a silicon nitride film (prophetic): using bis(1,2-dimethylpropylthio)silane and ammonia (NH$_3$) with ALD: using an ALD reactor and a bubbler containing the bis(1,2-dimethylpropylthio)silane of IEx. 2 and in fluid communication with the ALD reactor. First feed the bis(1,2-dimethylpropylthio)silane in helium to the ALD reactor, then stop the first feed and start a second feed of ammonia diluted in helium to the ALD reactor. Heat the bubbler containing bis(1,1-dimethylethylthio)silane to 70° C. to increase vapor pressure thereof. The ALD reactor contains a plurality of vertically oriented and spaced apart silicon wafers heated to from 60° to 250° C. Alternate the first and second feeds so that a conformal film containing silicon nitride is formed on the wafers.

IEx. D: Deposition of a silicon-containing film through decomposition of bis(1,1-dimethylethylthio)silane to form SiS$_2$: Computational modeling was conducted to determine the energy required for the decomposition of bis(1,1-dimethylethylthio)silane to SiS$_2$ and subsequent chemisorption of SiS$_2$ on a substrate with a carbon surface. The modeling employed Amsterdam Density Function (ADF) and Vienna Ab-initio Simulation Package (VASP) software applying Perdew-Burke-Ernzerhof (PBE) and Density Functional Theory (DFT) exchange-correlation functionals with a plane-wave basis set with a cutoff energy of 400 eV. Transition state structures were obtained using the nudged elastic band method. The experimental data indicated energy differentials and states consistent with a pathway in which bis(1,1-dimethylethylthio)silane decomposes under cracking conditions to produce SiS$_2$, and the chemisorption of SiS$_2$ onto a carbon surface.

IEx. E: Deposition of a silicon-containing film through decomposition of bis(amylthio)silane to form SiS$_2$: Computational modeling was conducted to determine the energy required for the decomposition of bis-(amylthio)silane to SiS$_2$ and subsequent chemisorption on a substrate with a carbon surface. The ADF basic algorithm was used (XC functional: PBE-D, Scalar Relativity, Basis Set TZT, No Frozen Core, Normal numerical quality) in a computation where a linear transit calculation was run with partial geometric optimization where the C—S bond was stretched and them the C—H bond was shrunken. Transition state structures were obtained using the nudged elastic band method. The experimental data indicated energy differentials and states consistent with a pathway in which bis(amylthio)silane decomposes under cracking conditions to produce SiS$_2$, and the chemisorption of SiS$_2$ onto a carbon surface.

The below claims are incorporated by reference here, and the terms "claim" and "claims" are replaced by the term "aspect" or "aspects," respectively. Embodiments of the invention also include these resulting numbered aspects.

What is claimed is:

1. A method of forming a silicon-containing film on a substrate, the method comprising: heating a thiodisilane according to formula (I)

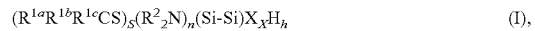

$(R^{1a}R^{1b}R^{1c}CS)_S(R^2_2N)_n(Si-Si)X_xH_h$     (I), wherein: subscript s is an integer from 1 to 6; subscript n is an integer from 0 to 5; subscript x is an integer from 0 to 5; subscript h is an integer from 0 to 5; with the proviso that sum s+n+x+h=6;

each H, when present in formula (I), is independently bonded to the same or different one of the silicon atoms in formula (I);

each X is a monovalent halogen atom F, Cl, I, or Br and, when present in formula (I), is independently bonded to the same or different one of the silicon atoms in formula (I);

wherein $R^{1a}$, $R^{1b}$, and $R^{1c}$ are defined by limitation (a), (b), or (c):

(a) at least one $R^{1a}$ independently is (C$_1$-C$_{20}$)alkyl or phenyl and each of any remaining $R^{1a}$, $R^{1b}$, and $R^{1c}$ independently is H or (C$_1$-C$_{20}$)hydrocarbyl; or (b) there is at least one group $R^{1a}R^{1b}R^{1c}$C that independently is a substituted or unsubstituted (C$_6$-C$_{20}$)aryl, and each of any remaining $R^{1a}$, $R^{1b}$, and $R^{1c}$ independently is H or (C$_1$-C$_{20}$)hydrocarbyl; or (c) any two of $R^{1a}$, $R^{1b}$, and $R^{1c}$ (collectively $R^1$ groups), in the same or different $R^{1a}R^{1b}R^{1c}$C group, are bonded together to form a divalent group, —$R^{11}$—, wherein —$R^{11}$— is a CH$_2$ or a (C$_3$-C$_{20}$)hydrocarbylene and each of any remaining $R^{1a}$, $R^{1b}$, and $R^{1c}$ independently is H or (C$_1$-C$_{20}$)hydrocarbyl;

each $R^2$ group independently is H or a (C$_1$-C$_{20}$)hydrocarbyl; or any two $R^2$ groups may be bonded together to form a divalent group, —$R^{22}$—, wherein —$R^{22}$— is a ($C_2$-$C_{20}$)hydrocarbylene and each of any remaining $R^2$ groups independently is H or a ($C_1$-$C_{20}$)hydrocarbyl;

each hydrocarbyl and hydrocarbylene independently is unsubstituted or substituted with from 1 to 5 substituents SUB; and each SUB independently is unsubstituted ($C_1$-$C_6$)alkyl, unsubstituted ($C_3$-$C_6$)cycloalkyl, unsubstituted ($C_2$-$C_6$) alkenyl, unsubstituted ($C_2$-$C_6$)alkynyl, unsubstituted ($C_6$-$C_7$)aryl, fluoro, chloro, or bromo, in a chemical vapor deposition (CVD) or atomic layer deposition (ALD) process under thermal or plasma conditions to give the silicon-containing film disposed on the substrate.

2. The method of claim 1:

wherein subscript s is an integer from 1 to 4; subscript n is an integer from 0 to 2; subscript x is an integer from 0 to 2; subscript h is an integer from 0 to 2; with the proviso that sum s+n+x+h=6; and wherein X, $R^{1a}$, $R^{1b}$, $R^{1c}$, and $R^2$ are as defined above for formula (I); or wherein subscript s is an integer from 1 to 4; each of subscripts n and x is 0; subscript h is 2 to 5; with the proviso that sum s+h=6; and wherein $R^{1a}$, $R^{1b}$, and $R^{1c}$ are as defined above for formula (I); or wherein subscript s is an integer from 1 to 4; each of subscripts n and h independently is from 1 to 5; subscript x is 0; with the proviso that sum s+n+h=6; and wherein $R^{1a}$, $R^{1b}$, $R^{1c}$, and $R^2$ are as defined above for formula (I).

3. The method of claim 1, wherein subscript s is 1 or 2, wherein:

each X is Cl and each ($C_1$-$C_{20}$)hydrocarbyl independently is a ($C_1$-$C_{12}$)hydrocarbyl, a ($C_1$-$C_8$)hydrocarbyl, or a ($C_3$-$C_8$)hydrocarbyl; wherein each hydrocarbyl is an unsubstituted alkyl, a substituted alkyl, an unsubstituted aryl, or an alkyl-substituted aryl, or subscript s is 1 or 2 and each X is Cl and each ($C_1$-$C_{20}$) hydrocarbyl independently is a ($C_1$-$C_{12}$)hydrocarbyl, a ($C_1$-$C_8$)hydrocarbyl, or a ($C_3$-$C_8$)hydrocarbyl; wherein each hydrocarbyl is an unsubstituted alkyl, a substituted alkyl, an unsubstituted aryl, or an alkyl-substituted aryl.

4. The method of claim 1, wherein the thiodisilane is according to formula (I-a):

$(R^{1a}R^{1b}R^{1c}CS)_s(Si-Si)H_h$      (I-a), wherein: subscript s is an integer from 1 to 6; subscript h is an integer from 0 to 5; with the proviso that sum s+h=6; and wherein $R^{1a}$, $R^{1b}$, and $R^{1c}$ are as defined above in claim 1.

5. The method of claim 4, wherein subscript s is an integer from 1 to 3; subscript h is an integer from 3 to 5; and each ($C_1$-$C_{20}$)hydrocarbyl independently is an unsubstituted ($C_1$-$C_6$)alkyl, substituted ($C_1$-$C_6$)alkyl, unsubstituted aryl, or a ($C_1$-$C_3$)alkyl-substituted ($C_6$)aryl, or wherein the thiodisilane is selected from: (1,1-dimethylethylthio)disilane; bis(1,1-dimethylethylthio)disilane; (phenylthio)disilane; bis(phenylthio)disilane; (t-pentylthio)disilane; bis(t-pentylthio)disilane; (benzylthio)disilane; bis(benzylthio)disilane; (2-methylphenylthio)disilane; bis(2-methylphenylthio)disilane; (2,6-dimethylphenylthio)disilane; bis(2,6-dimethylphenylthio)disilane; 1, 1-diphenylthiodisilane; (1,2-dimethylpropylthio)disilane; and bis(1,2-dimethylpropylthio) disilane.

6. A method of forming a film on a substrate, the method comprising: heating a thiosilane according to formula (A)

$(R^{1a}R^{1b}R^{1c}CS)_S(si)x_XH_h$      (A), wherein:
subscript s is an integer from 1 to 4;
subscript x is an integer from 0 to 3;
subscript h is an integer from 0 to 3;
with the proviso that sum s+x+h=4;
each X is a monovalent halogen atom F, Cl, or Br;
wherein $R^{1a}$, $R^{1b}$, and $R^{1c}$ are defined by limitation (a), (b), or (c): (a) $R^{1a}$ is ($C_1$-$C_6$)alkyl, $R^{1b}$ is ($C_2$-$C_6$)alkyl or H, and $R^{1c}$ is H; or (b) each of $R^{1a}$, $R^{1b}$, and $R^{1c}$ independently is ($C_1$-$C_6$)alkyl; or (c) $R^{1a}R^{1b}R^{1c}C$ together represents a substituted or unsubstitued phenyl group, wherein the substitute groups on the phenyl are one or more methyl groups;

each alkyl independently is unsubstituted or substituted with from 1 to 5 substituents SUB; and each SUB independently is unsubstituted ($C_1$-$C_6$)alkyl, unsubstituted ($C_3$-$C_6$)cycloalkyl, unsubstituted ($C_2$-$C_6$) alkenyl, unsubstituted ($C_2$-$C_6$)alkynyl, unsubstituted ($C_6$-$C_7$)aryl, fluoro, chloro, or bromo, in a chemical vapor deposition (CVD) or atomic layer deposition (ALD) process under thermal or plasma conditions to give a silicon-containing film disposed on the substrate.

7. The method of claim 6, wherein s is 2, x is 2, and h is 0, wherein $R^{1a}$ is ($C_1$-$C_6$)alkyl, $R^{1b}$ is ($C_3$-$C_6$)alkyl, and $R^{1c}$ is H; or wherein $R^{1a}$ is ($C_1$-$C_2$)alkyl, $R^{1b}$ is ($C_3$-$C_4$)alkyl, and $R^{1c}$ is H; or wherein each of $R^{1a}$, $R^{1b}$, and $R^{1c}$ independently is ($C_1$-$C_6$)alkyl; or wherein each of $R^{1a}$, $R^{1b}$, and $R^{1c}$ independently is ($C_1$-$C_2$)alkyl.

8. The method of claim 6, wherein the thiosilane is bis(1,1-dimethylethylthio)silane; bis(1,2-dimethylpropylthio)silane; dichloro-bis(1,2-dimethylpropylthio)silane; t-pentylthiosilane; bis(phenylthio)silane; phenylthiosilane; (benzylthio)silane; (2-methylphenylthio)silane; bis(2-methylphenylthio)silane; (2,6-dimethylphenylthio)silane; bis(2, 6-dimethylphenylthio)silane; or bis(2-methyl-phenylthio)silane.

9. The method of claim 1, further comprising: heating a co-reactant in the CVD or ALD process.

10. A method of depositing a silicon-containing film on a substrate, the method comprising: heating a co-reactant and a thio(di)silane in a chemical vapor deposition (CVD) or atomic layer deposition (ALD) process under thermal or plasma conditions to give a silicon-containing film disposed on the substrate; wherein the thio(di)silane is a thiodisilane selected from the group consisting of: methylthio-disilane; 1,2-Bis(phenylthio)-disilane; 1,4-Dithia-2,3-disilacyclohexane; 2,2,3,3,-Tetramethyl-1,4-dithia-2,3-disilacyclohexane; 2,3-Dihydro-2,2,3,3,-tetramethyl-1,4,2,3-benzo-dithiadisilane; 1,1,2,2-Tetramethyl-1,2-bis(methylthio)-disilane; 1,1,2,2-Tetramethyl-1,2-bis(ethylthio)-disilane; 1,1,2,2-Tetramethyl-1,2-bis(propylthio)-disilane; 1,1,2,2-Tetramethyl-1,2-bis(butylthio)-disilane; 1-Chloro-,1,2,2-trimethyl-1,2-bis(butylthio)-disilane; 1,2-Bis(butylthio)-1, 2-dichloro-1,2-dimethyl-disilane; 1,2-Bis [(1,1-dimethylethyl)thio]-1,1,2,2-tetramethyl-disilane; 1,2-Dichloro-1,2-bis [(1,1-dimethylethyl)thio]-1,2-dimethyl-disilane; Dihydro-2,2,4,6,6,8-hexamethyl-[1,4,2,3] dithiadisilolo[2,3-b][1,4,2,3]dithiadisilole, and combinations thereof.

11. A method of depositing a silicon-containing film on a substrate, the method comprising: heating a co-reactant and a thiosilane in a chemical vapor deposition (CVD) or atomic layer deposition (ALD) process under thermal or plasma conditions to give a silicon-containing film disposed on the substrate; wherein the thiosilane is selected from the group consisting of: Tri(methylthio)silane; Tri(ethylthio)silane; Tri (propylthio)silane; Tri(1-methylethylthio)silane; Trichloro-(ethylthio)silane; Trichloro-(butylthio)silane; Trichloro-(1,1-dimethylethylthio)silane; Dichloro-di(ethylthio)silane; Dichloro-di(butylthio)silane; Dichloro-di(1,1-dimethylethylthio)silane; Chloro-tri(methylthio)silane; Chloro-tri(ethylthio)silane; Chloro-tri(propylthio)silane; Chloro-tri(1-methylethylthio)silane; Tetra(methylthio)silane; Tetra(ethylthio)silane; Tetra(propylthio)silane; Tetra(1-methylethylthio)silane, and combinations thereof.

12. The method of claim 9, wherein the co-reactant comprises hydrogen sulfide or hydrogen disulfide and the film comprises a silicon sulfide; wherein the co-reactant comprises ammonia, molecular nitrogen, or hydrazine and the film comprises a silicon nitride; wherein the co-reactant comprises an organohydrazine, an amine, or an imine and the film comprises a silicon carbonitride; wherein the co-reactant comprises molecular oxygen, ozone, water, or hydrogen peroxide and the film comprises a silicon oxide; wherein the co-reactant comprises nitric oxide or nitrogen dioxide and the film comprises a silicon oxynitride; or wherein the co-reactant comprises an alcohol and the film comprises a silicon oxycarbonitride.

13. The method of claim 6, further comprising: heating a co-reactant in the CVD or ALD process.

14. The method of claim 10, wherein the co-reactant comprises hydrogen sulfide or hydrogen disulfide and the film comprises a silicon sulfide; wherein the co-reactant comprises ammonia, molecular nitrogen, or hydrazine and the film comprises a silicon nitride; wherein the co-reactant comprises an organohydrazine, an amine, or an imine and the film comprises a silicon carbonitride; wherein the co-reactant comprises molecular oxygen, ozone, water, or hydrogen peroxide and the film comprises a silicon oxide; wherein the co-reactant comprises nitric oxide or nitrogen dioxide and the film comprises a silicon oxynitride; or wherein the co-reactant comprises an alcohol and the film comprises a silicon oxycarbonitride.

15. The method of claim 11, wherein the co-reactant comprises hydrogen sulfide or hydrogen disulfide and the film comprises a silicon sulfide; wherein the co-reactant comprises ammonia, molecular nitrogen, or hydrazine and the film comprises a silicon nitride; wherein the co-reactant comprises an organohydrazine, an amine, or an imine and the film comprises a silicon carbonitride; wherein the co-reactant comprises molecular oxygen, ozone, water, or hydrogen peroxide and the film comprises a silicon oxide; wherein the co-reactant comprises nitric oxide or nitrogen dioxide and the film comprises a silicon oxynitride; or wherein the co-reactant comprises an alcohol and the film comprises a silicon oxycarbonitride.

16. The method of claim 6, wherein the co-reactant comprises hydrogen sulfide or hydrogen disulfide and the film comprises a silicon sulfide; wherein the co-reactant comprises ammonia, molecular nitrogen, or hydrazine and the film comprises a silicon nitride; wherein the co-reactant comprises an organohydrazine, an amine, or an imine and the film comprises a silicon carbonitride; wherein the co-reactant comprises molecular oxygen, ozone, water, or hydrogen peroxide and the film comprises a silicon oxide; wherein the co-reactant comprises nitric oxide or nitrogen dioxide and the film comprises a silicon oxynitride; or wherein the co-reactant comprises an alcohol and the film comprises a silicon oxycarbonitride.

* * * * *